US011004395B2

(12) United States Patent
Lee et al.

(10) Patent No.: US 11,004,395 B2
(45) Date of Patent: May 11, 2021

(54) DISPLAY DEVICE

(71) Applicant: Samsung Display Co., Ltd., Yongin-si (KR)

(72) Inventors: Juhee Lee, Asan-si (KR); Jongwoo Park, Seongnam-si (KR); Youngtae Choi, Cheonan-si (KR); Daeyoun Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 2 days.

(21) Appl. No.: 16/382,191

(22) Filed: Apr. 11, 2019

(65) Prior Publication Data

US 2019/0325827 A1 Oct. 24, 2019

(30) Foreign Application Priority Data

Apr. 23, 2018 (KR) ........................ 10-2018-0046650

(51) Int. Cl.
*G09G 3/3258* (2016.01)
*H05K 5/00* (2006.01)
*G09G 3/3266* (2016.01)
*G09G 3/3275* (2016.01)

(52) U.S. Cl.
CPC ......... *G09G 3/3258* (2013.01); *G09G 3/3266* (2013.01); *G09G 3/3275* (2013.01); *H05K 5/0017* (2013.01); *G09G 2300/043* (2013.01); *G09G 2300/0426* (2013.01); *G09G 2300/0439* (2013.01); *G09G 2330/021* (2013.01)

(58) Field of Classification Search
CPC ...... G09G 3/32; G09G 3/3258; G09G 3/3266; G09G 3/3275; H05K 5/0017
See application file for complete search history.

(56) References Cited

U.S. PATENT DOCUMENTS 9,196,197 B2 11/2015 Kim
9,293,519 B2 3/2016 Kwon et al.
9,922,586 B2 3/2018 Park et al.
(Continued)

FOREIGN PATENT DOCUMENTS

KR 10-2014-0104739 8/2014
KR 10-2016-0014129 2/2016
(Continued)

*Primary Examiner* — Alexander Eisen
*Assistant Examiner* — Cory A Almeida
(74) *Attorney, Agent, or Firm* — H.C. Park & Associates, PLC

(57) ABSTRACT

A display device includes a base layer, first pixels, second pixels, a power supply line (PSL), a power supply voltage supply circuit (PSVSC), and a feedback wire (FBW). The base layer includes a display area (DA) and a non-display area (NDA) adjacent to the DA. The DA includes a first pixel area (PA) including first pixels and a second PA including second pixels. The second PA protrudes from the first PA. The PSL extends in at least a first direction in the DA. The PSL receives a first power supply voltage (PSV) through a first end of the PSL, and supplies the first PSV to the first and second pixels. The PSVSC supplies the first PSV to the PSL through the first end. The FBW is electrically connected to a second end of the PSL disposed in the second PA. The FBW feeds back the first PSV to the PSVSC.

20 Claims, 16 Drawing Sheets

(56) References Cited

U.S. PATENT DOCUMENTS

| | | | | |
|---|---|---|---|---|
| 2007/0080908 | A1* | 4/2007 | Nathan | H05B 47/10 345/77 |
| 2016/0025791 | A1 | 1/2016 | Bae et al. | |
| 2016/0111040 | A1* | 4/2016 | Kim | G02F 1/13454 345/698 |
| 2018/0005585 | A1 | 1/2018 | Kim et al. | |

FOREIGN PATENT DOCUMENTS

| | | |
|---|---|---|
| KR | 10-2016-0053051 | 5/2016 |
| KR | 10-2016-0092147 | 8/2016 |
| KR | 10-2018-0003747 | 1/2018 |

* cited by examiner

DISPLAY DEVICE

CROSS-REFERENCE TO RELATED APPLICATION

This application claims priority from and the benefit of Korean Patent Application No. 10-2018-0046650, filed Apr. 23, 2018, which is hereby incorporated by reference for all purposes as if fully set forth herein.

BACKGROUND

Field

Exemplary embodiments generally relate to a display device, and more particularly, to a display device including a power supply voltage feedback structure.

Discussion

A display panel includes a display area for displaying an image according to an electrical signal. The display area of the display panel may have a square or circular shape, as well as an irregular shape. When a display panel is enlarged, the length of the wirings for transmitting signals in the display area is increased. Further, when the display panel has an irregular shape, the length of the wiring varies depending on the area. Accordingly, the resistance-capacitance (RC) value of the pixel may be changed according to the position of each pixel, and the amount of distortion of the power supply voltage applied to the pixel can be changed according to the position.

The above information disclosed in this section is only for understanding the background of the inventive concepts, and, therefore, may contain information that does not form prior art.

SUMMARY

Some exemplary embodiments are capable of providing a display device having a power supply voltage feedback structure.

Additional aspects will be set forth in the detailed description which follows, and, in part, will be apparent from the disclosure, or may be learned by practice of the inventive concepts.

According to some exemplary embodiments, a display device includes a base layer, first pixels, second pixels, a power supply line, a power supply voltage supply circuit, and a feedback wire. The base layer includes a display area and a non-display area adjacent to the display area. The display area includes a first pixel area and a second pixel area protruding from the first pixel area. The first pixels are in the first pixel area. The second pixels are in the second pixel area. The power supply line extends in at least a first direction in the display area. The power supply line is configured to receive a first power supply voltage through a first end of the power supply line, and supply the first power supply voltage to the first and second pixels. The power supply voltage supply circuit is configured to supply the first power supply voltage to the power supply line through the first end. The feedback wire is electrically connected to a second end of the power supply line disposed in the second pixel area. The feedback wire is configured to feed back the first power supply voltage to the power supply voltage supply circuit.

According to some exemplary embodiments, a display device includes a base layer, first pixels, second pixels, third pixels, power supply lines, a power supply voltage supply circuit, and a feedback wire. The base layer includes a display area and a non-display area adjacent to the display area. The display area includes a first pixel area, a second pixel area, and a third pixel area. The second pixel area and the third pixel area protrude from the first pixel area and are spaced apart from each other. The first pixels are in the first pixel area. The second pixels are in the second pixel area. The third pixels are in the third pixel area. The power supply lines extend in at least a first direction in the display area. The power supply lines are configured to: receive a first power supply voltage through first ends of the power supply lines, and supply the first power supply voltage to the first pixels, the second pixels, and the third pixels. A first group of the power supply lines is connected to a first some of the first pixels and the second pixels, a second group of the power supply lines is connected to a second some of the first pixels and the third pixels, and a third group of the power supply lines is connected to a third some of the first pixels. The power supply voltage supply circuit is configured to supply the first power supply voltage to the power supply lines through the first ends. The feedback wire is electrically connected to a second end of at least one of the power supply lines disposed in one of the second pixel area and the third pixel area. The feedback wire is configured to feed back the first power supply voltage to the power supply voltage supply circuit.

According to some exemplary embodiments, a display device includes a base layer, first pixels, second pixels, third pixels, power supply lines, a power supply voltage supply circuit, and a first feedback wire, and a second feedback wire. The base layer includes a display area and a non-display area adjacent to the display area. The display area includes a first pixel area, a second pixel area, and a third pixel area. The second and third pixel areas protrude from the first pixel area and are spaced apart from each other. The first pixels are in the first pixel area. The second pixels are in the second pixel area. The third pixels are in the third pixel area. The power supply lines extend in at least a first direction in the display area. The power supply lines are configured to: receive a first power supply voltage through first ends of the power supply lines, and supply the first power supply voltage to first pixels, the second pixels, and the third pixels. A first group of the power supply lines is connected to a first some of the first pixels and the second pixels, a second group of the power supply lines is connected to a second some of the first pixels and the third pixels, and a third group of the power supply lines is connected to a third some of the first pixels. The power supply voltage supply circuit is configured to supply the first power supply voltage to the power supply lines through the first ends. The first feedback wire is electrically connected to second ends of the power supply lines of the first and second groups to feed back the first power supply voltage to the power supply voltage supply circuit. The second feedback wire electrically connected to second ends of the power supply lines of the third group to feed back the first power supply voltage to the power supply voltage supply circuit.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
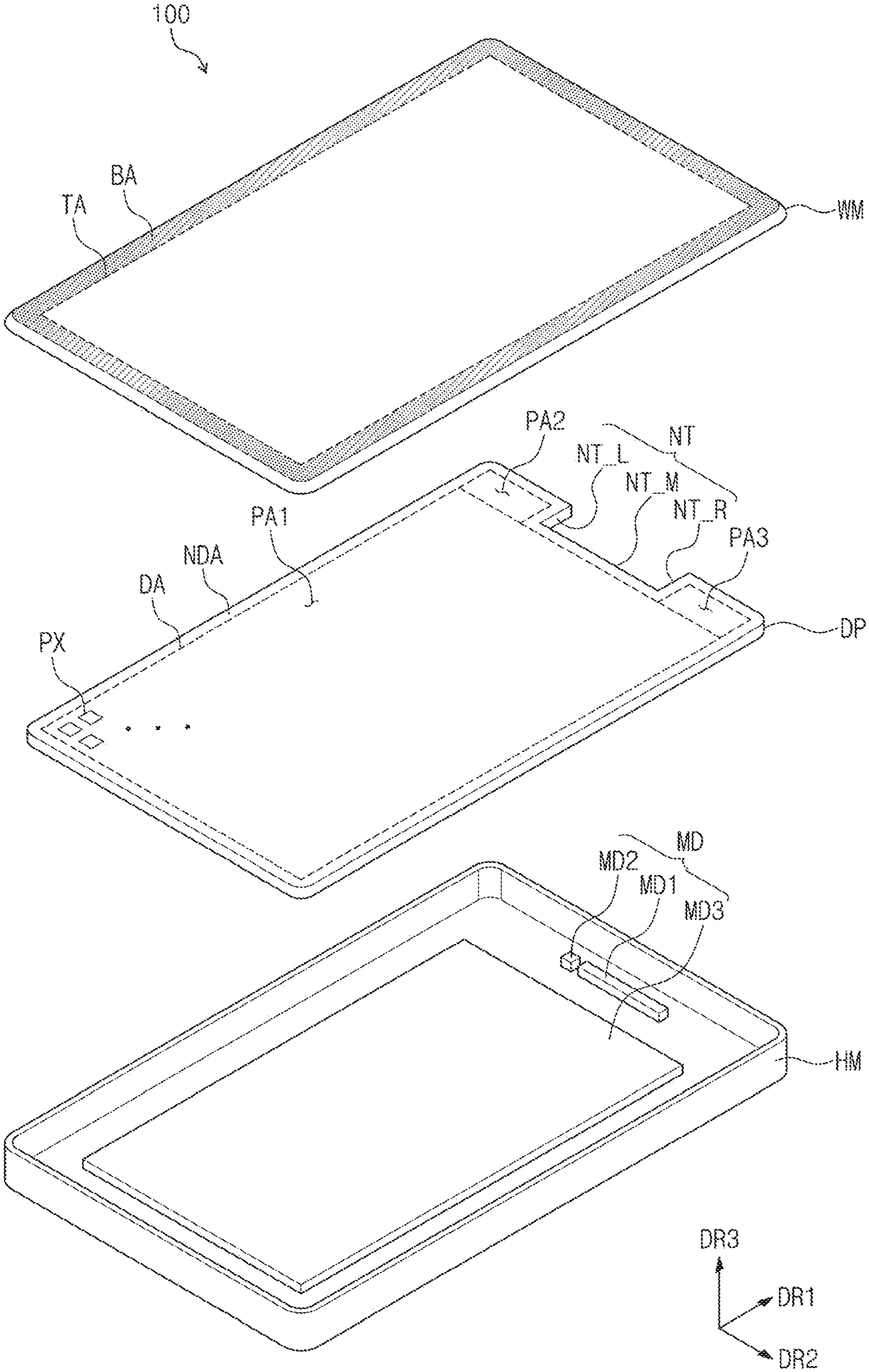
FIG. 1 is an exploded perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "lower side," "above," "upper," "upper side," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to cross-sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
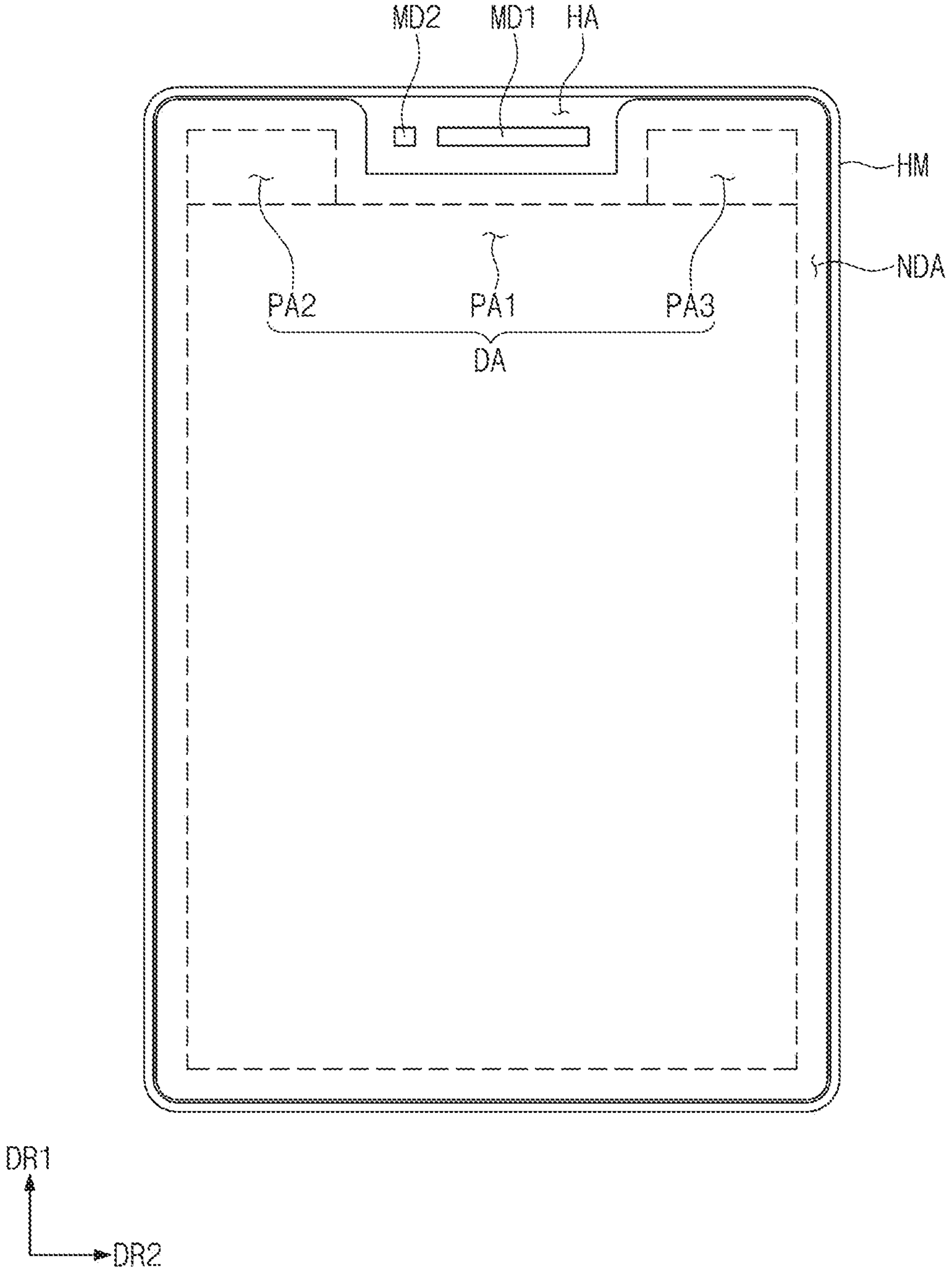
FIG. 2 is a plan view of the display device shown in FIG. 1 according to some exemplary embodiments.

FIG. 1 is an exploded perspective view of a display device according to some exemplary embodiments. FIG. 2 is a plan view of the display device shown in FIG. 1 according to some exemplary embodiments.

As shown in FIG. 1, the display device 100 includes a display panel DP, an external module MD, a housing member HM, and a window member WM. The external module MD may include a plurality of modules MD1, MD2, and MD3.

The display panel DP may include a display area DA for displaying an image according to an electrical signal and a non-display area NDA adjacent to the display area DA. The display panel DP may include a plurality of pixels PX. The pixels PX may be arranged in the display area DA.

The display panel DP may include at least one notch NT. For instance, the display panel DP may include four sides on a plane, and the notch NT may be formed in one of the sides in a recessed manner toward the center of the display panel DP.

The notch NT includes a first side surface NT_L, a second side surface NT_R, and a third side surface NT_M. Each of the first side surface NT_L and the second side surface NT_R extends along a first direction DR1 and is orthogonal to a second direction DR2. The first side surface NT_L and the second side surface NT_R may be surfaces facing each other in the second direction DR2. The notch NT may be defined by recessing the inside of the display panel DP while forming the first side surface NT_L or the second side surface NT_R along the first direction DR1. The third side surface NT_M extends along the second direction DR2 and is orthogonal to the first direction DR1. The third side surface NT_M may be a surface connecting the first side surface NT_L and the second side surface NT_R.

The display area DA includes a first pixel area PA1, a second pixel areas PA2, and a third pixel area PA3. The second and third pixel area PA2 and PA3 are protruded from the first pixel area PA1 and face each other with the notch NT interposed therebetween. In FIG. 1, the second and third pixel areas PA2 and PA3 are distinguished from the first pixel area PA1 through a virtual (or imaginary) line. The pixels PX may be disposed in the first pixel area PA1 and may be disposed in the second and third pixel areas PA2 and PA3. A more detailed description for this will be made later.

The external module MD may include a sound module MD1, an optical module MD2, and a power module MD3. Although referred to as being external, the external module MD may simply be external with respect to the display panel DP. The sound module MD1 may be a sound output module for outputting an electric signal as a sound signal and/or a sound input module for receiving an external sound signal and converting the external sound signal into an electric signal.

The optical module MD2 may be a light receiving module for receiving an external optical signal, such as infrared rays, and converting the received external optical signal into an electric signal, a light-emitting module for receiving an electric signal to output an optical signal, such as infrared rays or visible light, and/or a camera module for capturing an external subject.

The power module MD3 may supply power necessary for overall operation of the display device 100. The sound module MD1, the optical module MD2, and the display panel DP may receive power from the power module MD3. The power module MD3 may include a battery module.

Referring to FIG. 2, at least one of the external modules MD may be disposed in a recession (or recessed) area HA defined by the notch NT. For example, the sound module MD1 and the optical module MD2 are disposed in the recession area HA defined by the notch NT. As the display panel DP according to one embodiment includes the notch NT (see FIG. 1), it is possible to stably receive the external module MD and the display panel DP without increasing the size of the housing member HM. Thus, the display device DA may provide a bezel area with a small width.

Although not shown in the drawings, the external module MD may further include a bracket for fixing the configurations of the display device 100 including the display panel DP, the sound module MD1, the optical module MD2, and the power module MD3, a case for protecting the configurations of the display device 100, and an electronic module electrically connected to the various components of the display device 100. In addition, at least one of the sound module MD1, the optical module MD2, and the power module MD3 may be omitted.

The housing member HM provides a predetermined internal space. The display panel DP and the external module MD are received in the internal space of the housing member HM. As described above, since the notch NT of the display panel DP is provided with a portion of the external module MD, the size of the housing member HM may be prevented from increasing.

Referring again to FIG. 1, the window member WM may be disposed on the display panel DP. The window member WM protects the display panel DP. The window member WM may be coupled to the housing member HM to face to each other to form an inner space. The window member WM and the housing member HM may define the appearance of the display device 100.

The window member WM may be divided into a transmission area TA and a bezel area BA on a plane. The transmission area TA may be an area that transmits most of incident light. The transmission area TA is optically transparent.

The bezel area BA may be an area that shields most of incident light. The bezel area BA prevents the components disposed under the window member WM (e.g., under the bezel area BA of the window member WM) from being visible from the outside. Also, the bezel area BA may reduce reflection of light incident from outside the window member WM.

The bezel area BA may be adjacent to the transmission area TA. The shape of the transmission area TA on a plane may be defined by the bezel area BA. In an embodiment, the transmission area TA covers at least the display area DA of the display panel DP. The bezel area BA may cover the non-display area DA of the display panel DP. However, in another embodiment, the bezel area BA may cover a portion of the display area DA.

As seen in FIGS. 1 and 2, the transmission area TA may be formed to overlap the recession area HA defined by the notch NT. Accordingly, the modules MD1 and MD2 disposed in the recession area HA may be visually recognized from the outside. Also, the second and third pixel areas PA2 and PA3 may be visible from the outside by the transmission area TA. As such, an image displayed on the second and third pixel areas PA2 and PA3 may be easily provided to the user through the transmission area TA. However, this merely an example, and the transmission area TA may be defined as a shape corresponding to the first pixel area PA1 and the recession area HA, and the second and third pixel areas PA2 and PA3 may be covered by the bezel area BA. In this manner, the sound and optical modules MD1 and MD2 disposed in the recession area HA may not be visible from the outside.

Figure 3:
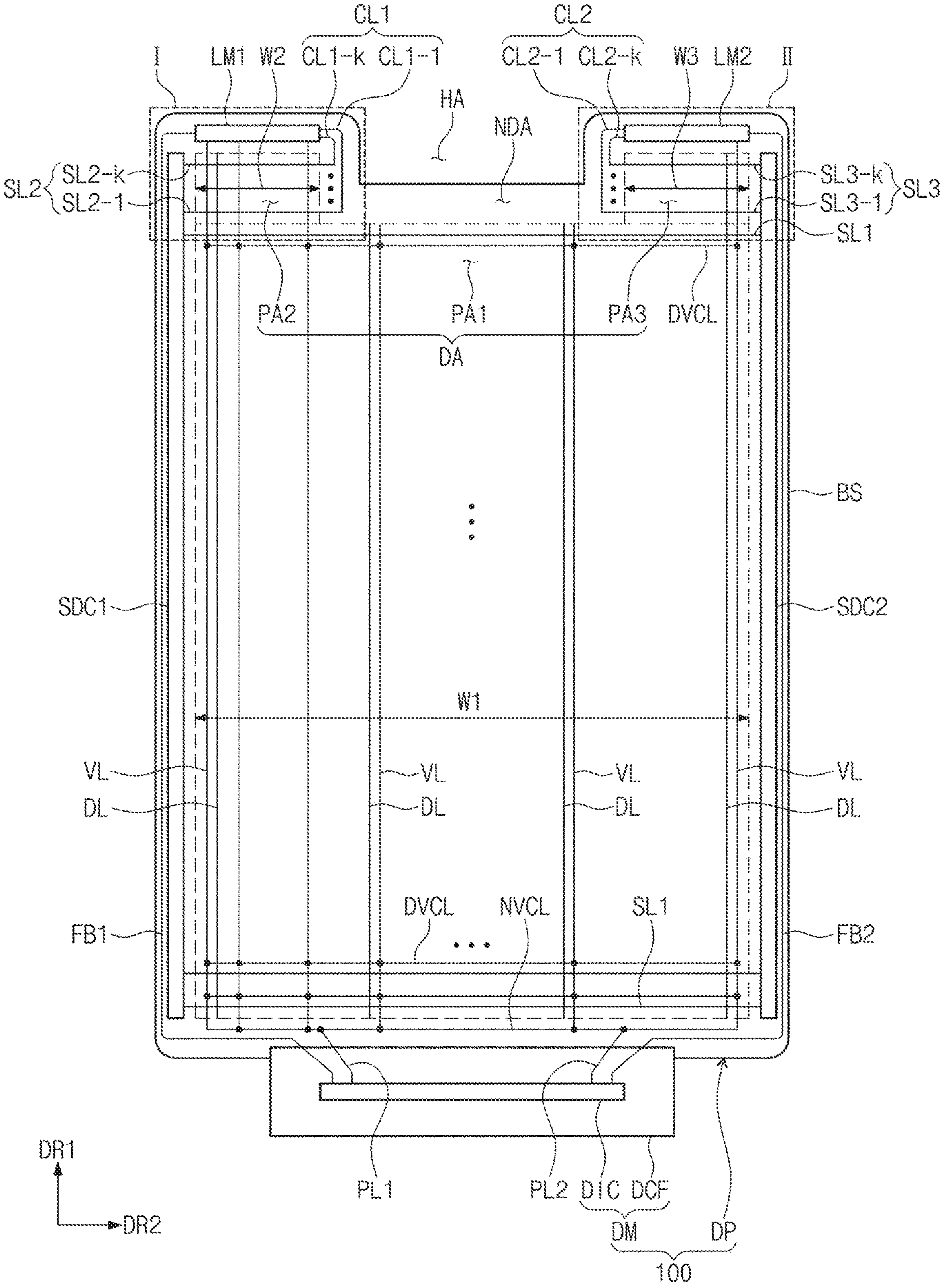
FIG. 3 is a plan view of a display device according to some exemplary embodiments.
Figure 4:
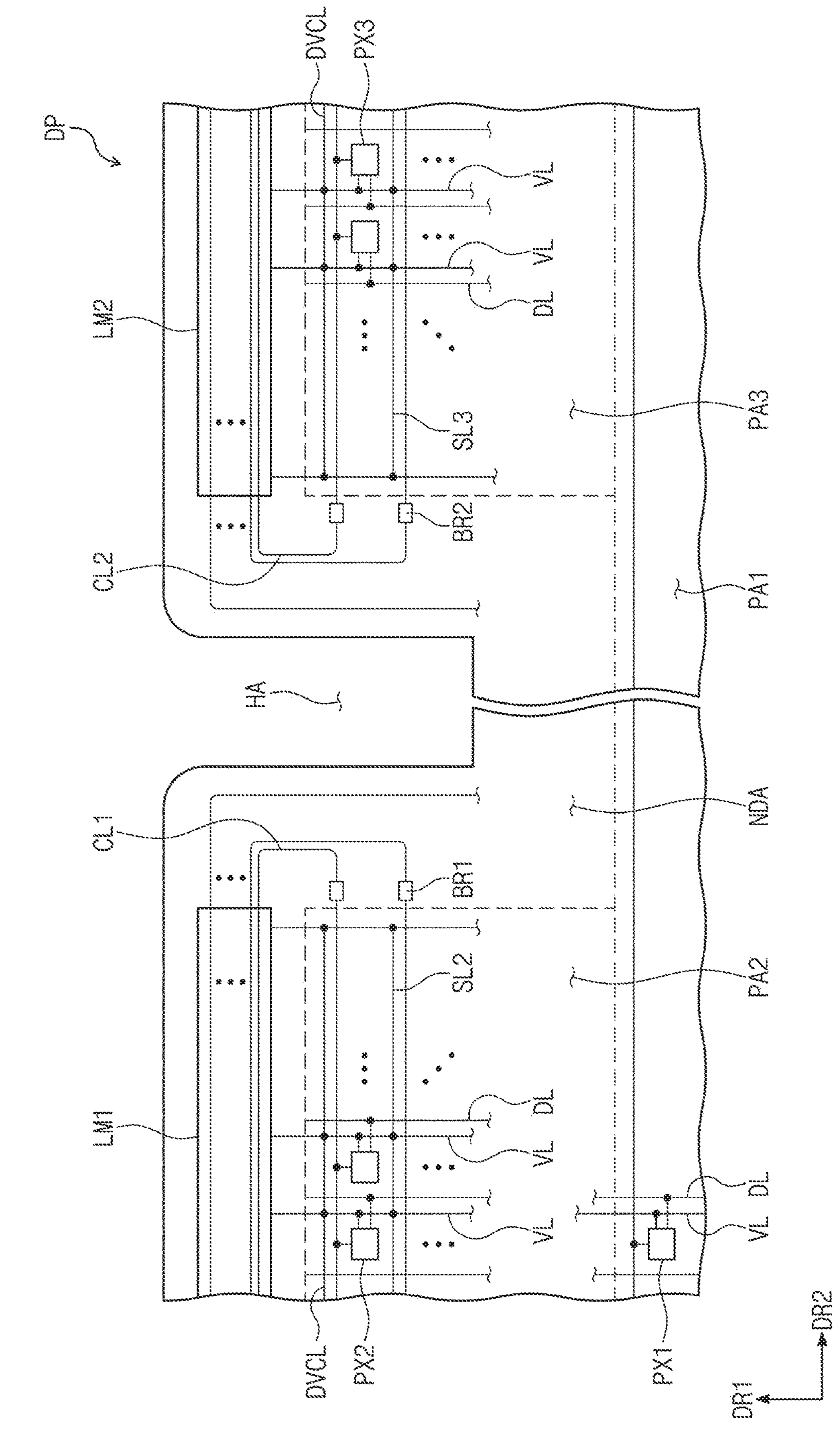
FIG. 4 is an enlarged plan view of second and third pixel areas shown in FIG. 3 according to some exemplary embodiments.

FIG. 3 is a plan view of a display device according to some exemplary embodiments. FIG. 4 is an enlarged plan view of second and third pixel areas shown in FIG. 3 according to some exemplary embodiments.

Referring to FIGS. 3 and 4, the display device 100 includes a display panel DP and a driving module DM.

The display panel DP may be a light-emitting display panel, but is not particularly limited. For example, the display panel DP may be an organic light-emitting display panel or a quantum dot light-emitting display panel. A light-emitting layer of the organic light-emitting display panel includes an organic light-emitting material. A light-emitting layer of a quantum dot light-emitting display panel includes at least one of a quantum dot and a quantum rod. Hereinafter, the display panel DP will be described as an organic light-emitting display panel.

The display panel DP may include a base layer BS, a plurality of pixels PX, scan driving circuits SDC1 and SDC2, signal lines DL, SL1 to SL3, and VL, compensation electrodes LM1 and LM2, compensation wires CL1 and CL2, and feedback wires FB1 and FB2.

A display area DA and a non-display area NDA adjacent to the display area DA may be defined on the base layer BS. The display panel DP may display an image in the display area DA and may not display an image in the non-display area NDA.

For convenience of explanation, it is described that the display area DA and the non-display area NDA of the base layer BS are the same as the display area DA and the non-display area NDA of the display panel DP (see FIGS. 1 and 2). However, the display area DA and the non-display area NDA of the base layer BS may not be necessarily identical to the display area DA and the non-display area NDA of the display panel DP, and may vary according to a structure/design of the display panel DP.

The display area DA may include a first pixel area PA1, a second pixel area PA2, and a third pixel area PA3. The first pixel area PA1 may have a rectangular shape on a plane. The second pixel area PA2 and the third pixel area PA3 may protrude from the first pixel area PA1 in the first direction DR1. The first pixel area PA1 may be referred to as a normal pixel area, and the second and third pixel areas PA2 and PA3 may be referred to as notch pixel areas.

Although the number of pixel areas provided protruding from the first pixel area PA1 is not limited, it is exemplarily shown that two pixel areas PA2 and PA3 are provided. The sound module MD1 and the optical module MD2 described with reference to FIGS. 1 and 2 may be disposed in the recession area HA between the second pixel area PA2 and the third pixel area PA3. The second pixel area PA2 may protrude in the first direction DR1 at one corner of the first pixel area PA1, and the third pixel area PA3 may protrude in the first direction DR1 from the other corner of the first pixel area PA1. The second pixel area PA2 and the third pixel area PA3 may be spaced apart from each other in the second direction DR2 that intersects the first direction DR1.

The plurality of pixels PX may be disposed in the display area DA to display an image. The pixels PX may be arranged in a matrix form, or may be arranged in a non-matrix form, such as a pentagonal form.

The pixels PX may include a first pixel PX1 disposed in the first pixel area PA1, a second pixel PX2 disposed in the second pixel area PA2, and a third pixel PX3 disposed in the second pixel PX3. The first to third pixels PX1, PX2, and PX3 may be provided in plurality.

The width W1 in the second direction DR2 of the first pixel area PA1 may be greater than the width W2 in the second direction DR2 of the second pixel area PA2. Therefore, the number of the first pixels PX1 arranged in the second direction DR2 in the first pixel area PA1 may be greater than the number of the second pixels areas PA2 arranged in the second direction DR2 in the second pixel area PA2. Here, the number of the first pixels PX1 arranged in the second direction DR2 and the number of the second pixels PX2 arranged in the second direction DR2 may mean the number of pixels in one row in the respective pixel areas.

The width W1 in the second direction DR2 of the first pixel area PA1 may be greater than the width W3 in the second direction DR2 of the third pixel area PA3. Therefore, the number of the first pixels PX1 arranged in the second direction DR2 in the first pixel area PA1 may be greater than the number of the third pixels areas PA3 arranged in the second direction DR2 in the third pixel area PA3. The number of the first pixels PX1 arranged in the second direction DR2 and the number of the third pixels PX3 arranged in the second direction DR2 may mean the number of pixels in one row parallel to the second direction DR2 in the respective pixel areas.

The signal lines may include scan lines SL1, SL2, and SL3, a data line DL, and a power supply line VL.

The scan lines SL1, SL2, and SL3 include first to third scan lines SL1 to SL3. The first scan line SL1 may be disposed in the first pixel area PA1, the second scan line SL2 may be disposed in the second pixel area PA2, and the third scan line SL3 may be disposed in the third pixel area PA3. The first scan line SL1 may have a longer length than the second and third scan lines SL2 and SL3.

The first to third scan lines SL1 to SL3, the data line DL, and the power supply line VL are connected to the pixels PX.

The scan driving circuits SDC1 and SDC2 may include a first scan driving circuit SDC1 and a second scan driving circuit SDC2. The first scan driving circuit SDC1 and the second scan driving circuit SDC2 may be disposed in the non-display area NDA. The first and second scan driving circuits SDC1 and SDC2 may generate a scan signal and output the generated scan signal to the first to third scan lines SL1 to SL3.

For instance, the first scan driving circuit SDC1 may be connected to one ends of the first scan line SL1 and the second scan line SL2, and the second scan driving circuit SDC2 may be connected to one ends of the first scan line SL1 and the third scan line SL3. To prevent the charging failure due to the delay of the scan signal applied to the first scan line SL1, the first and second scan driving circuits SDC1 and SDC2 may apply the scan signal to both ends of the first scan line SL1. However, exemplary embodiments are not limited to this, and only one scan driving circuit of the first and second scan driving circuits SDC1 and SDC2 may be connected to one end of the first scan line SL1 to apply the scan signal.

Although not shown, the first and second scan driving circuits SDC1 and SDC2 may include a plurality of thin film transistors formed through a same process as the pixels PX, for example, a low temperature polycrystalline silicon (LTPS) process or a low temperature polycrystalline oxide (LTPO) process.

The driving module DM may include a driving circuit chip DIC and a driving circuit film DCF. The driving circuit film DCF may be attached to the non-display area NDA of the display panel DP. The driving circuit chip DIC may be mounted on the driving circuit film DCF, but exemplary embodiments are not limited thereto. For example, the driving circuit chip DIC may be directly mounted on the non-display area NDA of the display panel DP.

The driving circuit chip DIC provides a signal for driving the display panel DP. That is, the driving circuit chip DIC may provide a signal to the data line DL and the power supply line VL. The driving circuit chip DIC may include a source driver integrated circuit (not shown) for providing a data signal to the data line DL and a power supply voltage supply circuit (not shown) for providing a first power supply voltage to the power supply line VL. However, the power supply voltage supply circuit may not be provided in the driving circuit chip DIC, but may be provided in (or mounted to) a separate printed circuit board. The power supply voltage supply circuit generates driving voltages for driving the first and second scan driving circuits SDC1 and SDC2, and supplies the driving voltage to the first and second scan driving circuits SDC1 and SDC2 through the driving circuit film DCF.

When the power supply voltage supply circuit is provided in the driving circuit chip DIC, the driving circuit chip DIC may have a power supply voltage output terminal (not shown) for outputting a first power supply voltage. As an example, the power supply voltage output terminal may include first and second power supply voltage output terminals.

The display panel DP may further include a first voltage supply line PL1, a second voltage supply line PL2, and common connection lines NVCL and DVCL. The first and second voltage supply lines PL1 and PL2 are provided in the non-display area NDA and are connected to the first and second power supply voltage output terminals, respectively. The common connection lines NVCL and DVCL include a first common connection line NVCL commonly connected to the power supply line VL in the non-display area NDA and a second common connection line DVCL commonly connected to the power supply line VL in the display area DA.

The first and second voltage supply lines PL1 and PL2 supply the first power supply voltage output from the first and second power supply voltage output terminals to the first common connection line NVCL. The first common connection line NVCL may be commonly connected to one end of the power supply line VL in the non-display area NDA to supply the first power supply voltage to the power supply line VL. Here, one end of the power supply line VL connected to the first common connection line NVCL may be defined as an input end of the power supply line VL. The second common connection line DVCL extends in the second direction DR2 and is arranged to intersect the power supply line VL in the display area DA. At the intersection, the second common connection line DVCL and the power supply line VL are electrically connected to each other.

The driving circuit chip DIC may further include a control signal circuit (not shown) for generating a scan control signal to control the driving of the first and second scan driving circuits SDC1 and SDC2. The scan control signals may be supplied to the first and second scan driving circuits SDC1 and SDC2 through control lines (not shown) provided on the display panel DP.

The compensation electrodes LM1 and LM2 may be disposed in the non-display area NDA. The compensation electrodes LM1 and LM2 may be provided in plurality. For example, the compensation electrodes LM1 and LM2 may include a first compensation electrode LM1 and a second compensation electrode LM2. However, this is merely an example, and the number of the compensation electrodes LM1 and LM2 may be one, three or more, and may be variously changed.

In FIGS. 3 and 4, the first compensation electrode LM1 is disposed in the non-display area NDA adjacent to the second pixel area PA2, and the second compensation electrode LM2 is disposed in the non-display area NDA adjacent to the third pixel area PA3.

The compensation wires CL1 and CL2 may be provided in plurality. For example, the compensation wires CL1 and CL2 may include a first compensation wire CL1 and a second compensation wire CL2.

The first compensation wire CL1 is electrically connected to the second pixel PX2 disposed in the second pixel area PA2 and extends to the non-display area NDA and overlaps the first compensation electrode LM1 on a plane. The second compensation wire CL2 is electrically connected to the third pixel PX3 disposed in the third pixel area PA3 and extends to the non-display area NDA and overlaps the second compensation electrode LM2 on a plane.

The first compensation wire CL1 may be electrically connected to the second scan lines SL2 and the second compensation wire CL2 may be electrically connected to the third scan lines SL3. The second and third scan lines SL2 and SL3 may be disposed on different layers from the first and second compensation wires CL1 and CL2. Therefore, the second scan lines SL2 and the first compensation wire CL1 may be electrically connected through a first bridge pattern BR1, and the third scan lines SL3 and the second compensation wire CL2 may be electrically connected through a second bridge pattern BR2.

According to some exemplary embodiments, the number of the first pixels PX1 arranged in the second direction DR2 in the first pixel area PA1 may be different from the number of the second pixels areas PA2 arranged in the second direction DR2 in the second pixel area PA2. Therefore, the sum of the RC values in one row may be different in the first pixel area PA1 and the second pixel area PA2. To compensate for this difference, the first compensation wire CL1 may be electrically connected to the second pixels PX2 disposed in the second pixel area PA2, and the first compensation wire CL1 extends to overlap the first compensation electrode LM1. Therefore, by the capacitance and resistance formed between the first compensation wire CL1 and the first compensation electrode LM1, the RC value of the second pixel area PA2 that is different (e.g., insufficient) as compared to the first pixel area PA1 may be compensated. Similarly, the second compensation wire CL2 may be electrically connected to the third pixels PX3 disposed in the third pixel area PA3, and the second compensation wire CL2 extends to overlap the second compensation electrode LM2. Therefore, by the capacitance and resistance formed between the second compensation wire CL2 and the second compensation electrode LM2, the RC value of the third pixel area PA3 that is different (e.g., insufficient) as compared to the first pixel area PA1 may be compensated. Therefore, the difference between the response speeds in the second pixel area PA2 and the third pixel area PA3 and the response speed of the first pixel area PA1 may be reduced, and accordingly, it is possible to display an image having a uniform luminance in the first to third pixel areas PA1 to PA3.

The first and second compensation electrodes LM1 and LM2 may be electrically connected to the power supply lines VL to receive the first power supply voltage. However, this is merely illustrative and the first and second compensation electrodes LM1 and LM2 may receive a second power supply voltage to be described later from the power supply voltage upply circuit or receive a driving voltage for driving the first and second scan driving circuits SDC1 and SDC2.

In FIG. 3, the feedback wires FB1 and FB2 are disposed in the non-display area NDA. As one example, the feedback wires FB1 and FB2 include a first feedback wire FB1 and a second feedback wire FB2. The first feedback wire FB1 is connected to the first compensation electrode LM1 and the second feedback wire FB2 is connected to the second compensation electrode LM2.

The first and second compensation electrodes LM1 and LM2 are connected to the other end of the power supply line VL opposite to the input end of the power supply line VL. Due to RC delay, the magnitude (hereinafter referred to as a first level) of the first power supply voltage measured at an input end of the power supply line VL and the magnitude (hereinafter referred to as a second level) of the first power supply voltage measured at the other end of the power supply line VL may vary. The first and second feedback wires FB1 and FB2 are respectively connected to the first and second compensation electrodes LM1 and LM2 connected to the other end of the power supply line VL to feed back the first power supply voltage of the second level to the driving circuit chip DIC.

Although not shown in the drawings, the driving circuit chip DIC may further include a compensation circuit for receiving the feedback of the first power supply voltage of the second level to generate a compensation signal and providing the compensation signal to the power supply voltage supply circuit.

Figure 5:
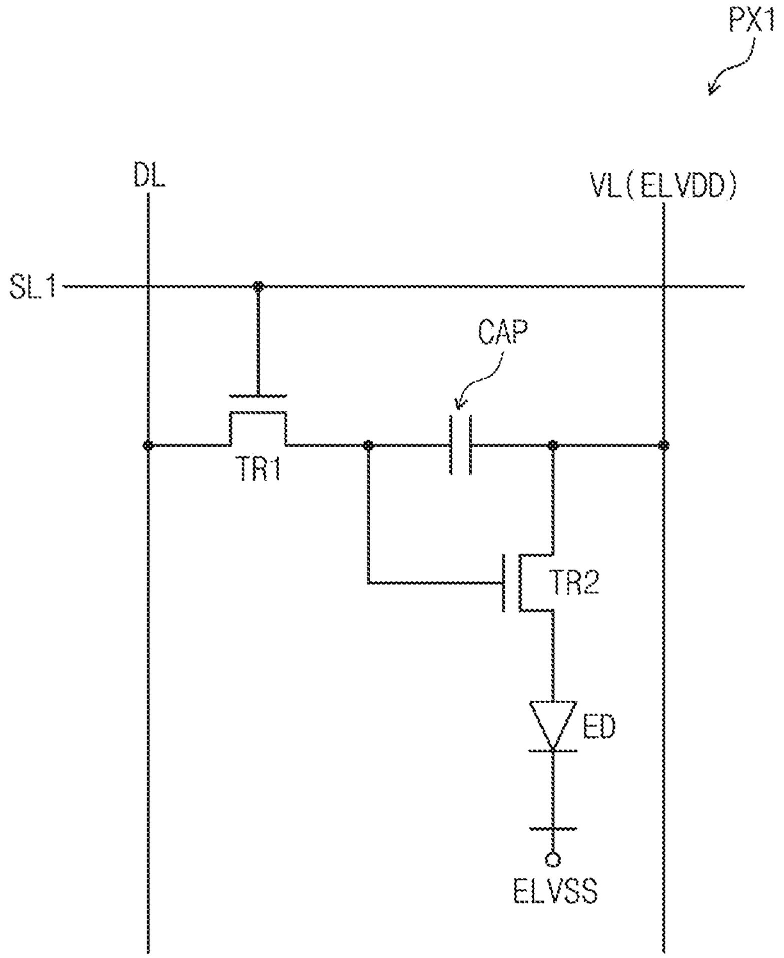
FIG. 5 is an equivalent circuit diagram of a pixel according to some exemplary embodiments.

FIG. 5 is an equivalent circuit diagram of a pixel according to some exemplary embodiments. Since the pixels PX include the first to third pixels PX1, PX2, and PX3 and the first to third pixels PX1, PX2, and PX3 have the same structure, except that they are disposed in different areas, FIG. 5 shows an equivalent circuit diagram of the first pixel PX1 that is representative of the corresponding structures of the first to third pixels PX1, PX2, and PX3.

Referring to FIG. 5, the first pixel PX1 is connected to one first scan line SL1, one data line DL, and one power supply line VL. The first pixel PX1 may include a switching transistor TR1, a driving transistor TR2, a capacitor CAP, and a light-emitting element ED. However, this is merely illustrative, and the circuit(s) constituting the first pixel PX1 may be variously changed.

The switching transistor TR1 outputs a data signal applied to the data line DL in response to a scan signal applied to the first scan line SL1. The capacitor CAP charges a voltage corresponding to the data signal received from the switching transistor TR1.

The driving transistor TR2 controls a driving current flowing in the light-emitting element ED in correspondence to the amount of charge stored in the capacitor CAP. A control electrode of the driving transistor TR2 may be connected between the switching transistor TR1 and the capacitor CAP.

The light-emitting element ED may be an organic light-emitting diode. The light-emitting element ED may be a top emission type diode or a bottom emission type diode. Alternatively, the light-emitting element ED may be a double-sided light-emitting diode.

A first power supply voltage ELVDD and a second power supply voltage ELVSS may be applied to the first pixel PX1. The first power supply voltage ELVDD may be applied to the first pixel PX1 through the power supply line VL and the second power supply voltage ELVSS may be applied to the first pixel PX1 through a power supply electrode (not shown), which may be connected to the light-emitting element ED. The voltage level of the first power supply voltage ELVDD may be higher than the voltage level of the second power supply voltage ELVSS.

The first and second compensation electrodes LM1 and LM2 described with reference to FIGS. 3 and 4 may receive the first power supply voltage ELVDD through the power supply line VL. Alternatively, as another embodiment, the first and second compensation electrodes LM1 and LM2 may receive the second power supply voltage ELVSS.

Figure 6:
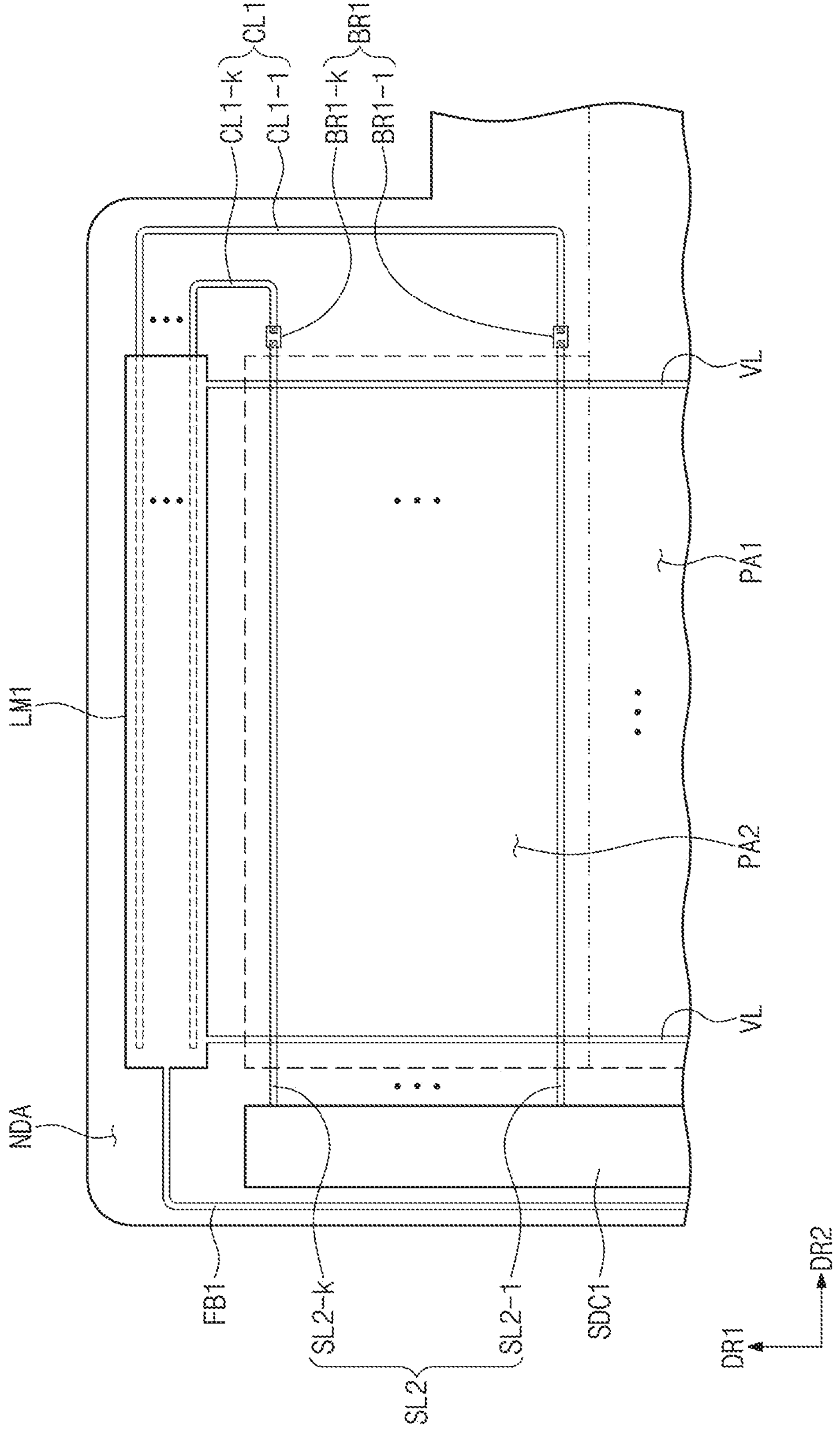
FIG. 6 is an enlarged plan view of the portion I in FIG. 3 according to some exemplary embodiments.
Figure 7:
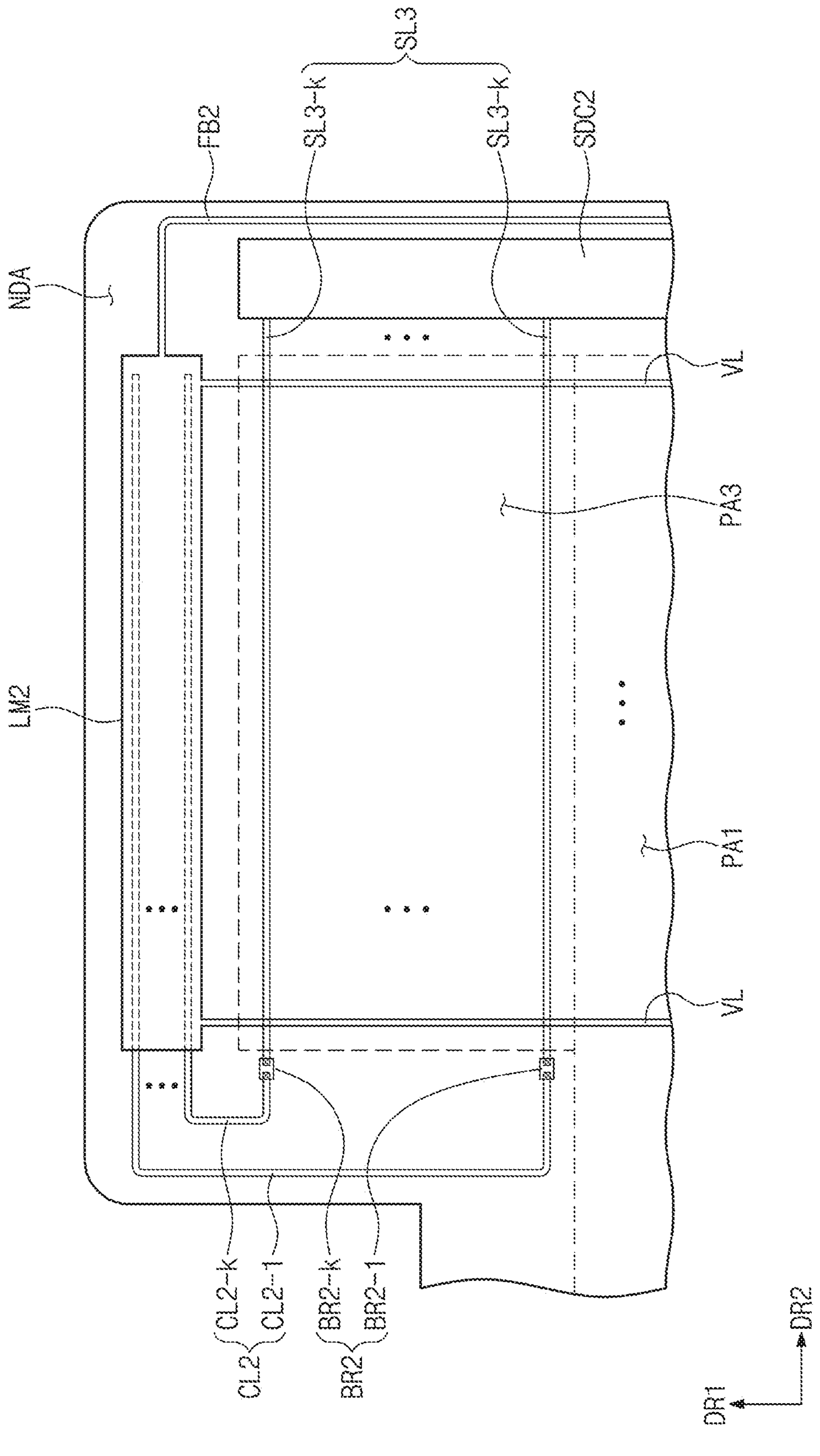
FIG. 7 is an enlarged plan view of the portion II in FIG. 3 according to some exemplary embodiments.

FIG. 6 is an enlarged plan view of the portion I in FIG. 3 according to some exemplary embodiments. FIG. 7 is an enlarged plan view of the portion II in FIG. 3 according to some exemplary embodiments.

Referring to FIG. 6, the second scan line SL2 is provided in the second pixel area PA2 and the first compensation wire CL1 is provided in the non-display area NDA adjacent to the second pixel area PA2. The second scan line SL2 includes first to k-th left scan lines SL2-1 to SL2-*k*, and the first compensation wire CL1 includes first to k-th left compensation wires CL1-1 to CL1-*k*. The first to k-th left scan lines SL2-1 to SL2-*k* are electrically connected to the first to k-th left compensation wires CL1-1 to CL1-*k*, respectively. The first to k-th left compensation wires CL1-1 to CL1-*k* may extend to face the first compensation electrode LM1.

The first bridge pattern BR1 may include first to k-th left bridge patterns BR1-1 to BR1-*k* for electrically connecting the first to the k-th left scan lines SL2-1 to SL2-*k* to the first to k-th left compensation wires CL1-1 to CL1-*k*, respectively, in the non-display area NDA.

The other end of the power supply line VL is connected to the first compensation electrode LM1. The first compensation electrode LM1 may be formed on (or in) the same layer as the power supply line VL and extend from the power supply line VL. However, exemplary embodiments are not limited thereto. The first feedback wire FB1 may be formed on (or in) the same layer as the power supply line VL and the first compensation electrode LM1 and may be branched from one side of the first compensation electrode LM1.

Referring to FIG. 7, the third pixel area PA3 is provided with the third scan line SL3 and the non-display area NDA adjacent to the third pixel area PA3 is provided with the second compensation wire CL2. The third scan line SL3 includes first to k-th right scan lines SL3-1 to SL3-*k*, and the second compensation wire CL2 includes first to k-th right compensation wires CL2-1 to CL2-*k*. The first to k-th right scan lines SL3-1 to SL3-*k* are electrically connected to the first to k-th right compensation wires CL2-1 to CL2-*k*, respectively. The first to k-th right compensation wires CL2-1 to CL2-*k* may extend to face the second compensation electrode LM2.

The second bridge pattern BR2 may include first to k-th right bridge patterns BR2-1 to BR2-*k* for electrically connecting the first to the k-th right scan lines SL3-1 to SL3-*k* to the first to k-th right compensation wires CL2-1 to CL2-*k*, respectively, in the non-display area NDA.

The other end of the power supply line VL is connected to the second compensation electrode LM2. The second compensation electrode LM2 may be formed on (or in) the same layer as the power supply line VL and extend from the power supply line VL. However, exemplary embodiments are not limited thereto. In addition, the second feedback wire FB2 may be formed on (or in) the same layer as the power supply line VL and the second compensation electrode LM2 and may be branched from one side of the second compensation electrode LM2.

Figure 8:
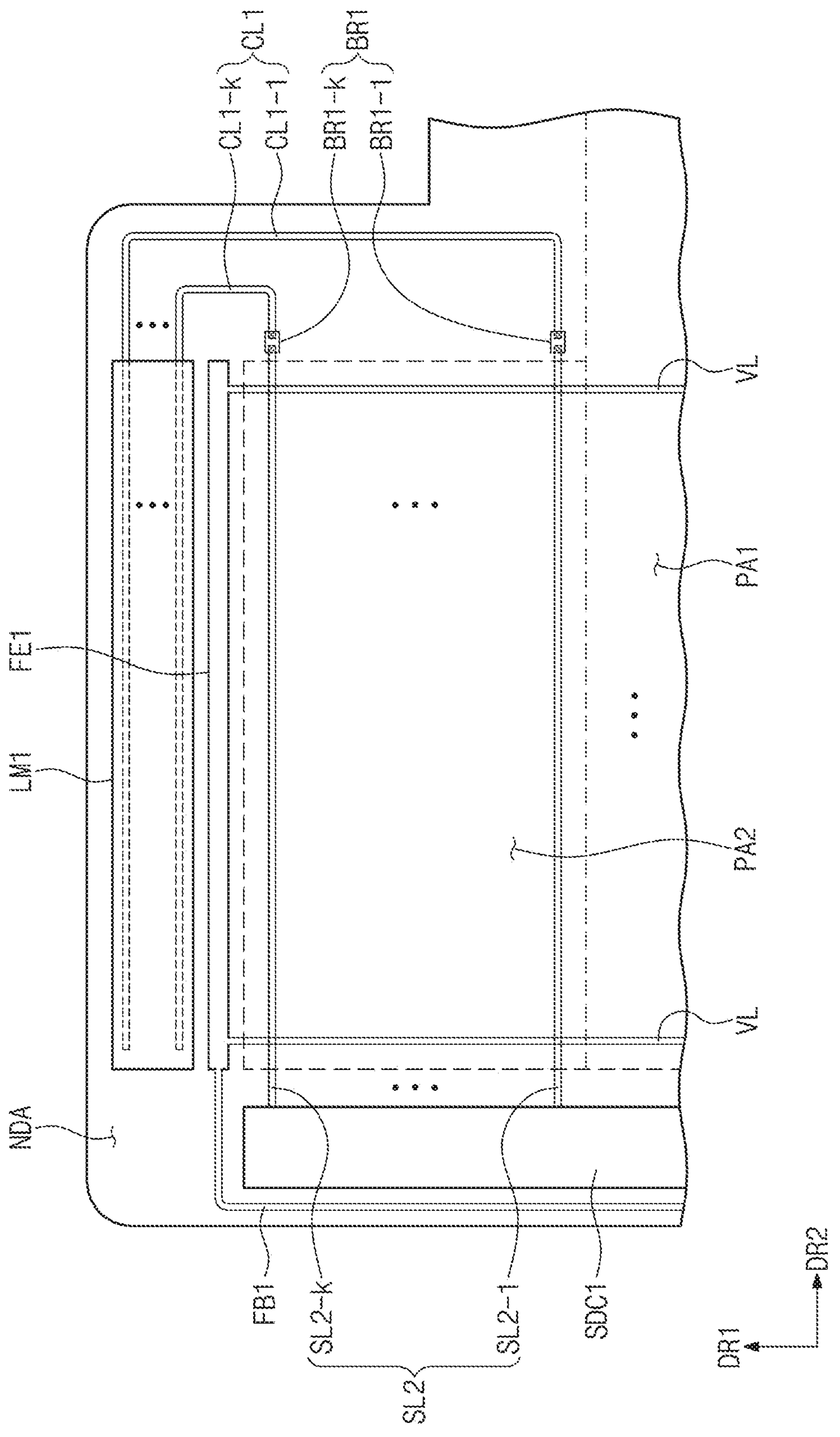
FIG. 8 is an enlarged plan view of a portion of a display panel according to some exemplary embodiments.

FIG. 8 is an enlarged plan view of a portion of a display panel according to some exemplary embodiments.

Referring to FIG. 8, in a display panel according to another embodiment, the first compensation electrode LM1 is electrically separated from the power supply line VL. Although not shown in the drawings, the first compensation electrode LM1 may be electrically connected to a power supply electrode disposed in the second pixel area PA2 to receive the second power supply voltage ELVSS (see FIG. 5). The first compensation electrode LM1 may form a capacitance by facing the first to the k-th left compensation wires CL1-1 to CL1-*k*.

In FIG. 8, the display panel further includes a feedback electrode FE1. The feedback electrode FE1 may be disposed between the first compensation electrode LM1 and the power supply line VL and may be electrically connected to the power supply line VL. The feedback electrode FE1 may be formed on (or in) the same layer as the power supply line VL and extend from the power supply line VL. However, exemplary embodiments are not limited thereto. For example, the feedback electrode FE1 may be formed on a different layer from the power supply line VL and may be in contact with the power supply line VL through a contact hole (not shown) or other structure. The first feedback wire FB1 may be formed on (or in) the same layer as the feedback electrode FE1 and may be branched from one side of the feedback electrode FE1. However, exemplary embodiments are not limited thereto. In another embodiment, the first feedback wire FB1 may be formed on a different layer from the feedback electrode FE1 and may be in contact with the feedback electrode FE1 through a contact hole (not shown) or other structure.

Figure 9:
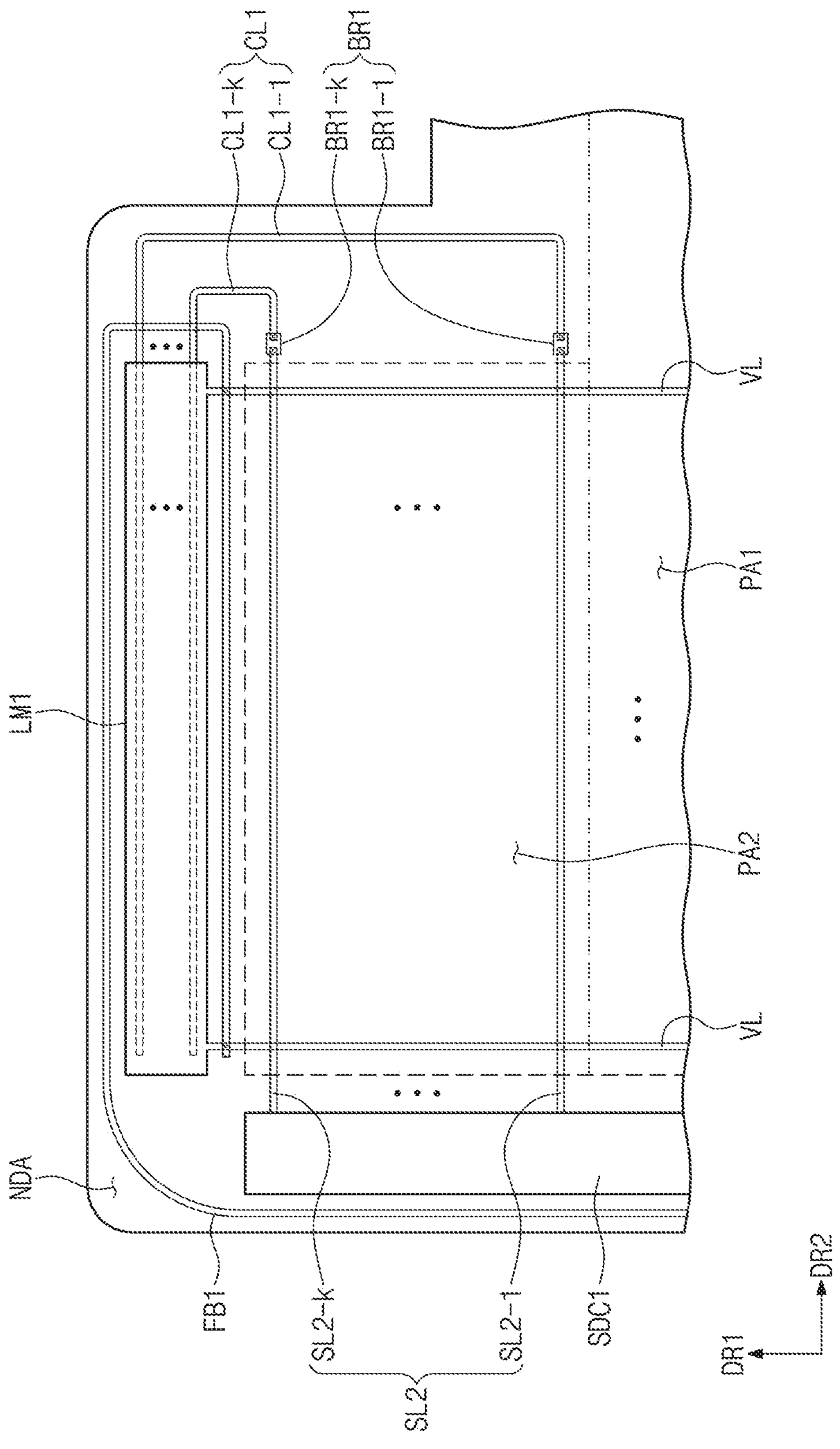
FIG. 9 is an enlarged plan view of a portion of a display panel according to some exemplary embodiments.

FIG. 9 is an enlarged plan view of a portion of a display panel according to some exemplary embodiments.

Referring to FIG. 9, in a display panel according to another embodiment, the first feedback wire FB1 is arranged to intersect the other end of the power supply line VL in the non-display area NDA. The first feedback wire FB1 may be disposed on a different layer from the power supply line VL and may be in contact with the other end of the power supply line VL through a contact hole.

The first compensation electrode LM1 is connected to the other end of the power supply line VL to receive the first power supply voltage through the power supply line VL. The first feedback wire FB1 may be spaced apart from the first compensation electrode LM1.

Figure 10:
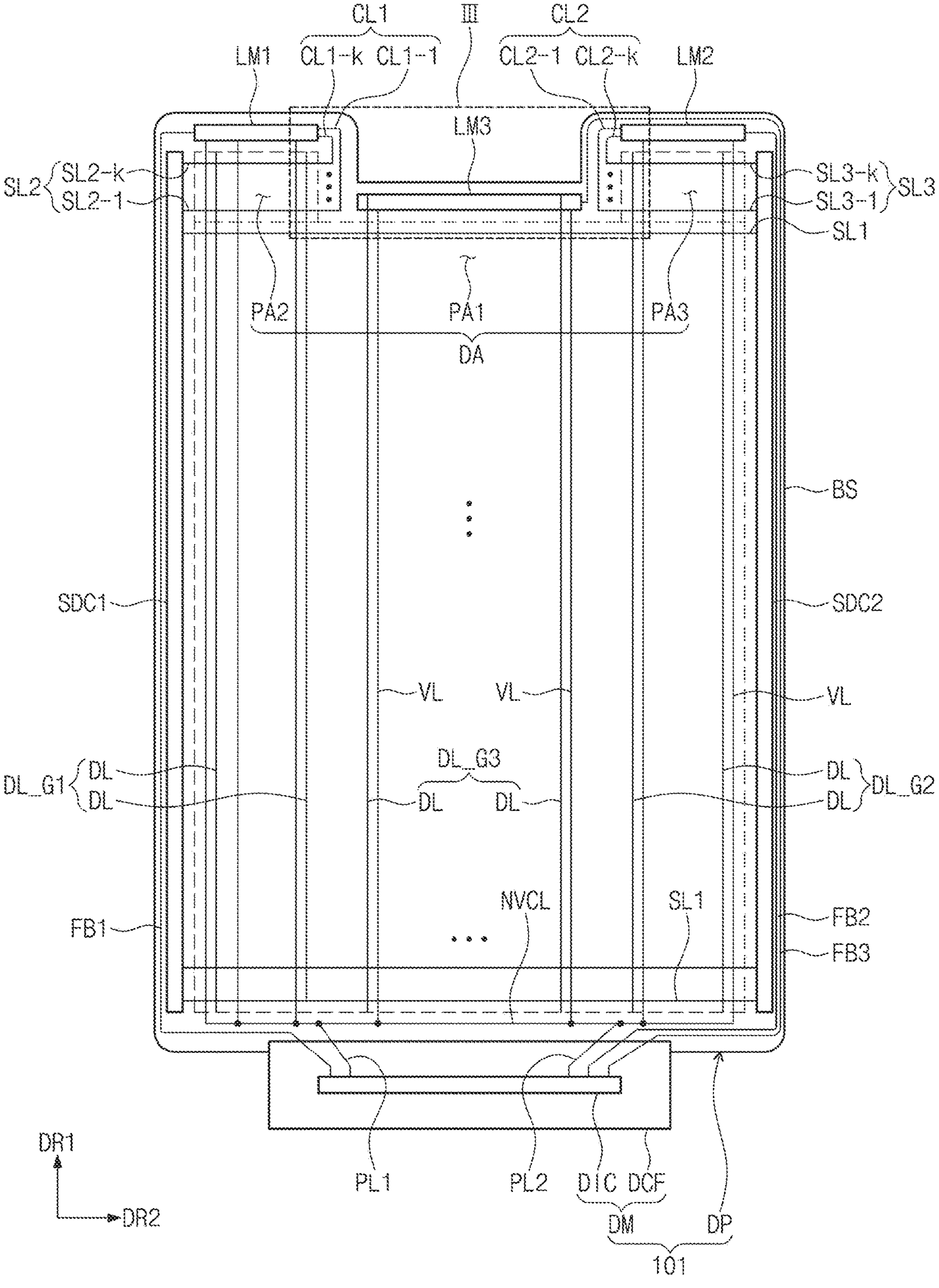
FIG. 10 is a plan view of a display device according to some exemplary embodiments.
Figure 11:
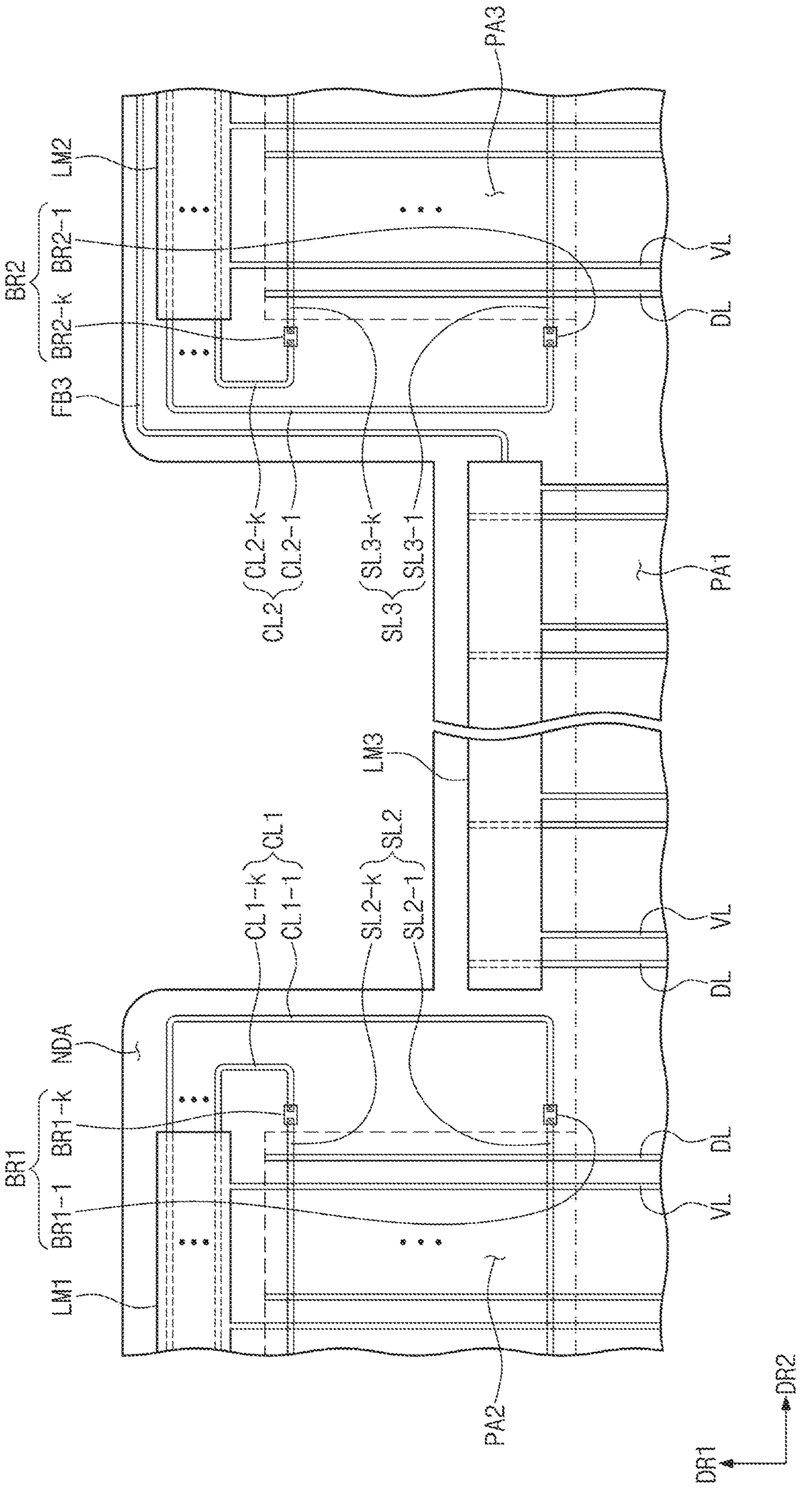
FIG. 11 is an enlarged plan view of the portion III shown in FIG. 10 according to some exemplary embodiments.

FIG. 10 is a plan view of a display device according to some exemplary embodiments. FIG. 11 is an enlarged plan view of the portion III shown in FIG. 10 according to some exemplary embodiments. The same reference numerals are used for components identical to the components shown in FIG. 10 among components shown in FIG. 10 and a detailed description thereof is redundant, and thus, will be omitted.

In FIGS. 10 and 11, in relation to the display device 101 according to another embodiment, the display panel DP may include a base layer BS, a plurality of pixels PX, scan drive circuits SDC1 and SDC2, signal lines DL, SL1 to SL3, and VL, compensation electrodes LM1, LM2, and LM3, compensation wires CL1 and CL2, and feedback wires FB1, FB2, and FB3.

In some embodiments, the compensation electrodes LM1, LM2, and LM3 include a first compensation electrode LM1, a second compensation electrode LM2, and a third compensation electrode LM3. The first compensation electrode LM1 is disposed in the non-display area NDA adjacent to the second pixel area PA2, and the second compensation electrode LM2 is disposed in the non-display area NDA adjacent to the third pixel area PA3. The third compensation electrode LM3 is disposed in the non-display area NDA disposed between the second and third pixel areas PA2 and PA3.

The compensation wires CL1 and CL2 may be provided in plurality. For example, the compensation wires CL1 and CL2 may include a first compensation wire CL1 and a second compensation wire CL2. The first compensation wire CL1 may extend into the non-display area NDA and may overlap the first compensation electrode LM1 on a plane. The second compensation wire CL2 may extend into the non-display area NDA and may overlap the second compensation electrode LM2 on a plane. The first compensation wire CL1 may be electrically connected to the second scan lines SL2 through a first bridge pattern BR1, and the second compensation wire CL2 may be electrically connected to the third scan lines SL3 through a second bridge pattern BR2.

Each of the first to third compensation electrodes LM1, LM2, and LM3 may be electrically connected to the power supply lines VL to receive the first power supply voltage. However, this is merely illustrative, and the first to third compensation electrodes LM1, LM2, and LM3 may receive a second power supply voltage to be described later from the power supply voltage supply circuit or receive a driving voltage for driving the first and second scan driving circuits SDC1 and SDC2.

The data lines DL may be divided into a first group DL_G1 extending from the first pixel area PA1 to the second pixel area PA2, a second group DL_G2 extending from the first pixel area PA1 to the third pixel area PA3, and a third group DL_G3 disposed in the first pixel area PA1 between the first group DL_G1 and the second group DL_G2. The data lines of the first group DL_G1 are connected to the first pixels PX1 and the second pixels PX2. The data lines of the second group DL_G2 are connected to the first pixels PX1 and the third pixels PX3. The data lines of the third group DL_G3 are connected to the first pixels PX1.

Therefore, the number of pixels connected to the data lines DL of the first and second groups DL_G1 and DL_G2 and the number of pixels connected to the data lines DL of the third group DL_G3 may be different from each other. Therefore, the sum of the RC values in one column of pixels may be different between the first and second groups DL_G1 and DL_G2 and the third group DL_G3. To compensate for this difference, the data line DL of the third group DL_G3 extends to the non-display area NDA and overlaps the third compensation electrode LM3. Therefore, by the capacitance and the resistance formed between the data line DL of the third group DL_G3 and the third compensation electrode LM3, the RC values that are difference (e.g., insufficient) as compared with the data lines DL of the first and second groups DL_G1 and DL_G2 may be compensated. Thus, the difference in the response speed between the first and second groups DL_G1 and DL_G2 of the data lines DL and the third group DL_G3 of the data lines DL may be reduced, and accordingly, an image having a uniform luminance in the first to third pixel areas PA1 to PA3 may be displayed.

The display panel DP may further include a first voltage supply line PL1, a second voltage supply line PL2, and a first common connection line NVCL. As such, the display device described in association with FIGS. 10 and 11 may not include the second common connection line DVCL as compared with the display device described in association with FIGS. 3 and 4. The first and second voltage supply lines PL1 and PL2 are provided in the non-display area NDA and connected to the first and second power supply voltage output terminals (not shown), respectively. The first common connection line NVCL is commonly connected to the input end of the power supply line VL in the non-display area NDA.

The first and second voltage supply lines PL1 and PL2 supply the first power supply voltage outputted from the first and second power supply voltage output terminals to the first common connection line NVCL. The first common connection line NVCL may be commonly connected to the input end of the power supply line VL in the non-display area NDA to supply the first power supply voltage to the power supply line VL.

Moreover, FIG. 10 shows a structure in which the second common connection line DVCL (see FIG. 3) that commonly connects the power supply lines VL in the display area DA is not provided. However, exemplary embodiments are not limited thereto. As shown in FIG. 3, the second common connection line DVCL may be provided in the display area DA in the display device described in association with FIGS. 10 and 11.

The feedback wires FB1, FB2, and FB3 are disposed in the non-display area NDA. As an example, the feedback wires FB1, FB2, and FB3 include a first feedback wire FB1, a second feedback wire FB2, and a third feedback wire FB3. The first feedback wire FB1 is connected to a first compensation electrode LM1, the second feedback wire FB2 is connected to a second compensation electrode LM2, and the third feedback wire FB3 Is connected to a third compensation electrode LM3.

The first to third compensation electrodes LM1, LM2, and LM3 are connected to the other end of the power supply line VL opposite to the input end of the power supply line VL. The magnitudes of the first power supply voltages measured at the input end of the power supply line VL and the other end of the power supply line VL may be varied due to RC delay. The first and second feedback wires FB1 and FB2 are respectively connected to the first and second compensation electrodes LM1 and LM2 connected to the other end of the power supply line VL to feed back the first power supply voltage to the driving circuit chip DIC. The third feedback wire FB3 is connected to the third compensation electrode LM3 connected to the other end of the power supply line VL to feed back the first power supply voltage to the driving circuit chip DIC.

Although not shown in the drawings, the driving circuit chip DIC may further include a compensation circuit for receiving the feedback of the first power supply voltage to generate a compensation signal and providing the compensation signal to the power supply voltage supply circuit.

Figure 12:
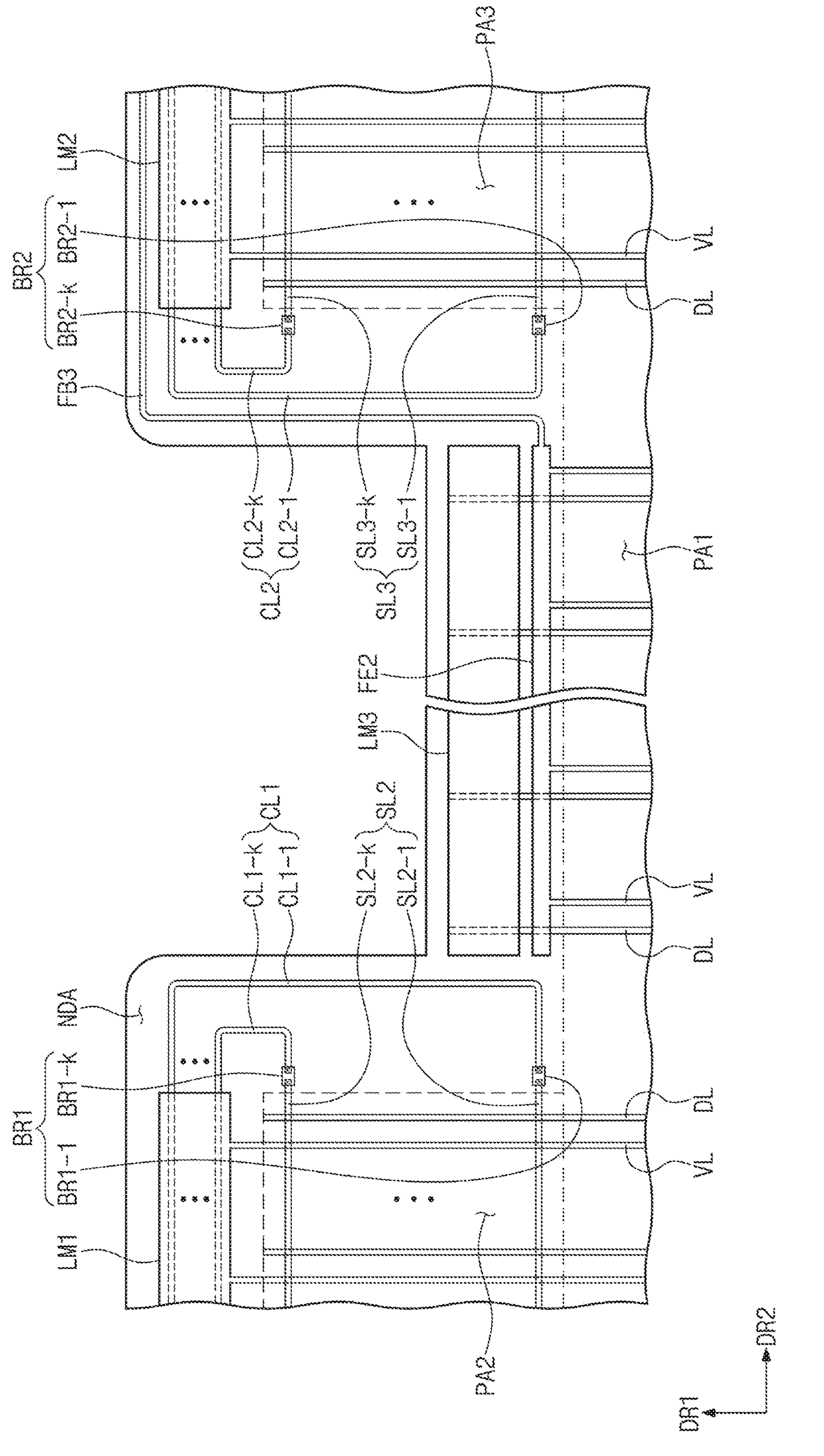
FIG. 12 is an enlarged plan view of a portion of a display panel according to some exemplary embodiments.

FIG. 12 is an enlarged plan view of a portion of a display panel according to some exemplary embodiments.

Referring to FIG. 12, in a display panel according to another embodiment, the third compensation electrode LM3 is electrically separated from the power supply line VL. Although not shown in the drawings, the third compensation electrode LM3 may be electrically connected to a power supply electrode disposed in the first pixel area PA1 to receive the second power supply voltage ELVSS (see FIG. 5).

In FIG. 12, the display panel further includes a feedback electrode FE2. The feedback electrode FE2 may be disposed between the third compensation electrode LM3 and the power supply line VL and may be electrically connected to the power supply line VL. The feedback electrode FE2 may be formed on (or in) the same layer as the power supply line VL and extend from the power supply line VL. However, exemplary embodiments are not limited thereto. For example, the feedback electrode FE2 may be formed on a different layer from the power supply line VL and may be in contact with the power supply line VL through a contact hole (not shown) or other structure.

As an example, the third feedback wire FB3 may be formed on (or in) the same layer as the feedback electrode FE2 and may be branched from one side of the feedback electrode FE2. However, exemplary embodiments are not limited thereto. In another embodiment, the third feedback wire FB3 may be formed on a different layer from the feedback electrode FE2 and may be in contact with the feedback electrode FE2 through a contact hole (not shown) or other structure.

Figure 13:
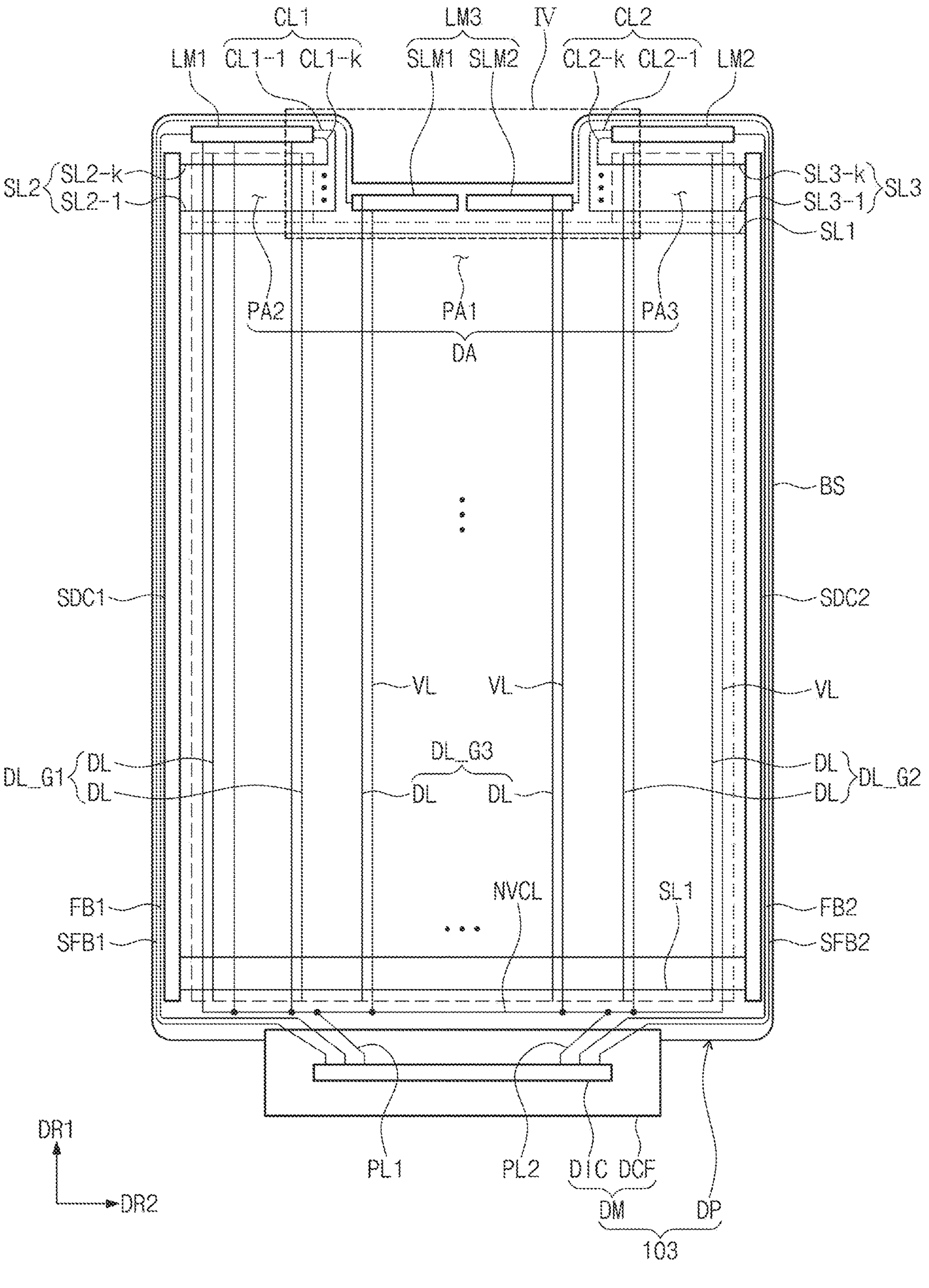
FIG. 13 is a plan view of a display device according to some exemplary embodiments.
Figure 14:
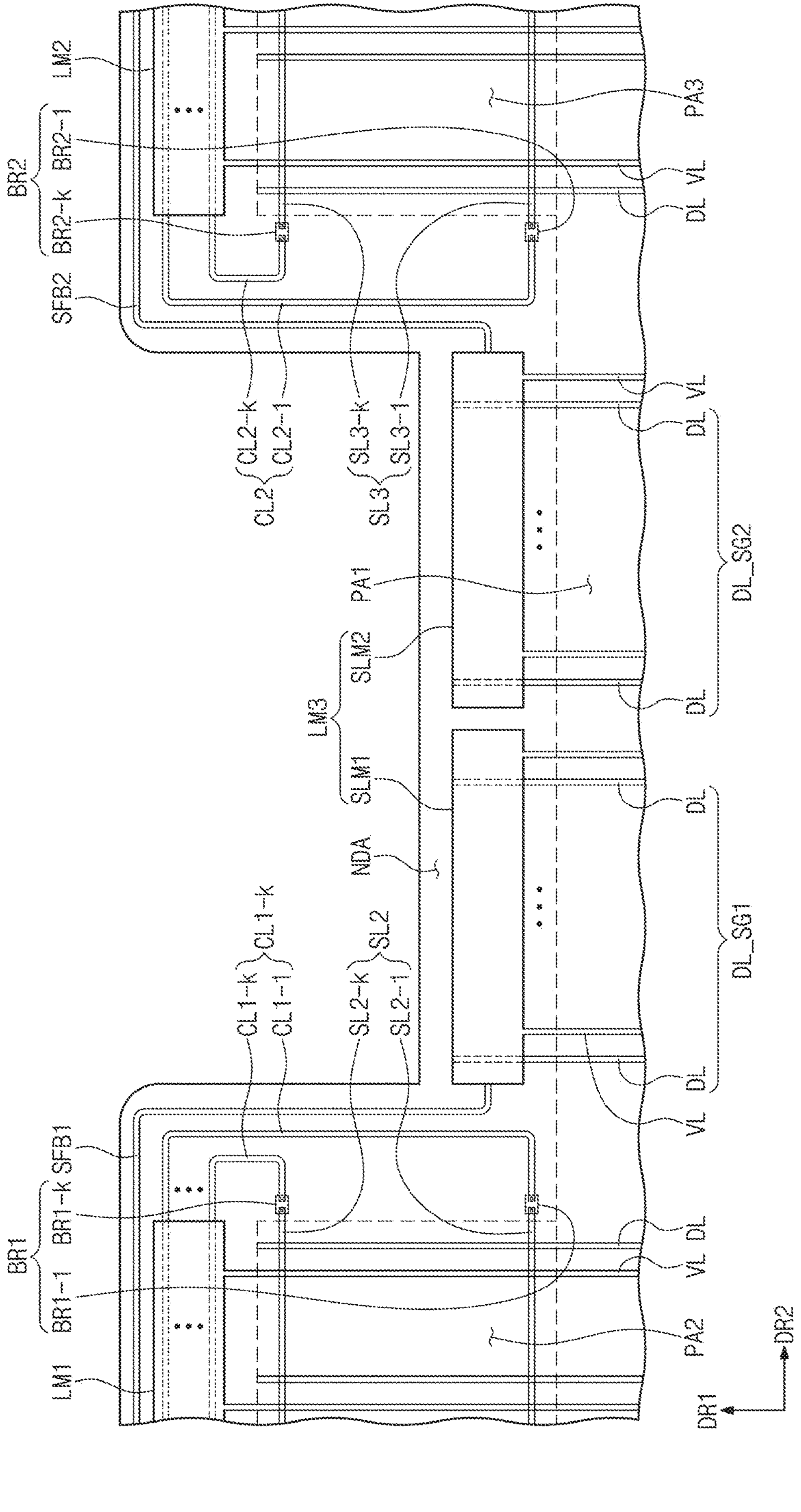
FIG. 14 is an enlarged plan view of the portion IV in FIG. 13 according to some exemplary embodiments.

FIG. 13 is a plan view of a display device according to some exemplary embodiments. FIG. 14 is an enlarged plan view of the portion IV in FIG. 13 according to some exemplary embodiments. The same reference numerals are used for components identical to the components shown in FIG. 10 among components shown in FIGS. 13 and 14, and a detailed description thereof is redundant, and thus, will be omitted.

In FIGS. 13 and 14, in relation to the display device 103 according to another embodiment, the compensation electrodes LM1, LM2, and LM3 include a first compensation electrode LM1, a second compensation electrode LM2, and a third compensation electrodes LM3. Since the first and second compensation electrodes LM1 and LM2 have the same structure as those shown in FIG. 10, their description will be omitted. The third compensation electrode LM3 is disposed in the non-display area NDA disposed between the second and third pixel areas PA2 and PA3. The third compensation electrode LM3 includes a first sub-compensation electrode SLM1 and a second sub-compensation electrode SLM2. The first and second sub compensation electrodes SLM1 and SLM2 may be spaced apart from each other in the second direction DR2 in the non-display area NDA.

Each of the first and second compensation electrodes LM1 and LM2 and the first and second sub-compensation electrodes SLM1 and SLM2 is electrically connected to the power supply lines VL to receive the first power supply voltage. However, this is merely illustrative, and each or some of the first and second compensation electrodes LM1 and LM2 and the first and second sub-compensation electrodes SLM1 and SLM2 may receive a second power supply voltage to be described later from the power supply voltage supply circuit. In addition, each or some of the first and second compensation electrodes LM1 and LM2 and the first and second sub-compensation electrodes SLM1 and SLM2 may receive a driving voltage for driving the first and second scan driving circuits SDC1 and SDC2.

The data lines DL may be divided into a first group DL_G1 extending from the first pixel area PA1 to the second pixel area PA2, a second group DL_G2 extending from the first pixel area PA1 to the third pixel area PA3, and a third group DL_G3 disposed in the first pixel area PA1 between the first group DL_G1 and the second group DL_G2. The data lines of the third group DL_G3 may be again separated into a first sub-group DL_SG1 and a second sub-group DL_SG2.

The data line DL of the first sub-group DL_SG1 extends to the non-display area NDA to overlap the first sub-compensation electrode SLM1, and the data line of the second sub-group DL_SG2 extends to the non-display area NDA to overlap the second sub-compensation electrode SLM2. Therefore, by the capacitance and the resistance formed between the data line DL of the third group DL_G3 and the third compensation electrode LM3, the RC values that are different (e.g., insufficient) as compared with the data lines DL of the first and second groups DL_G1 and DL_G2 may be compensated. Thus, the difference in the response speed between the first and second groups DL_G1 and DL_G2 of the data lines DL and the third group DL_G3 of the data lines DL may be reduced, and accordingly, an image having a uniform luminance in the first to third pixel areas PA1 to PA3 may be displayed.

The feedback wires FB1, FB2, SFB1, and SFB2 are disposed in the non-display area NDA. As an example, the feedback wires FB1, FB2, SFB1, and SFB2 include a first feedback wire FB1, a second feedback wire FB2, a first sub-feedback wire SFB1, and a second sub-feedback wire SFB2. The first sub-feedback wire SFB1 is connected to the first sub-compensation electrode SLM1 and the second sub-feedback wire SFB2 is connected to the second sub-compensation electrode SLM2. The first sub-feedback wire SFB1 may be connected to the first sub-compensation electrode SLM1 to feed back the first power supply voltage to the driving circuit chip DIC. Also, the second sub-feedback wire SFB2 may be connected to the second sub-compensation electrode SLM2 to feed back the first power supply voltage to the driving circuit chip DIC.

Although not shown in the drawings, the driving circuit chip DIC may further include a compensation circuit for receiving the feedback of the first power supply voltage to generate a compensation signal and providing the compensation signal to the power supply voltage supply circuit.

Figure 15:
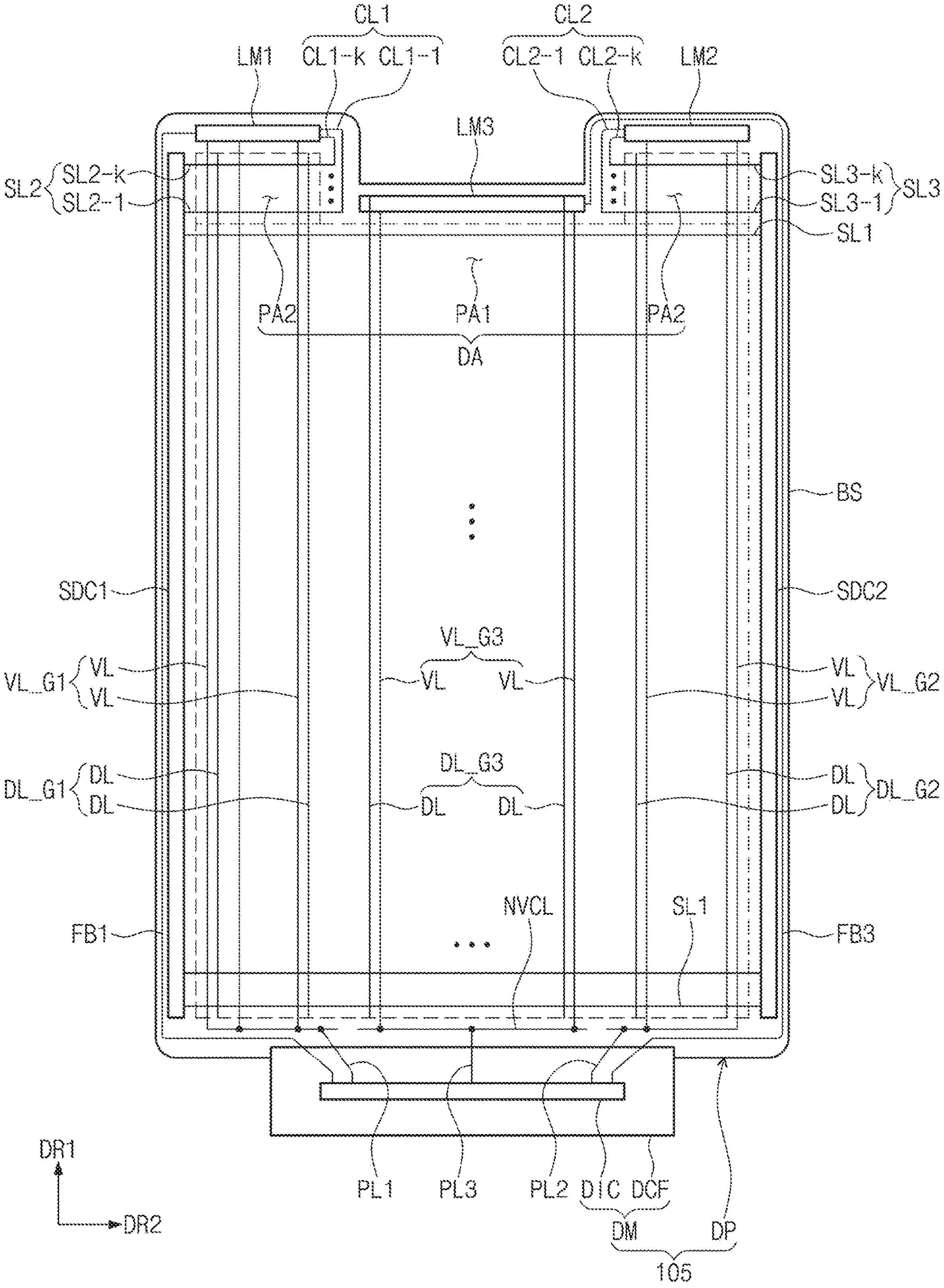
FIG. 15 is a plan view of a display device according to some exemplary embodiments.

FIG. 15 is a plan view of a display device according to some exemplary embodiments. The same reference numerals are used for components identical to the components shown in FIG. 10 among components shown in FIG. 15, and a detailed description thereof is redundant, and thus, will be omitted.

In FIG. 15, in relation to the display device 105 according to another embodiment, the compensation electrodes LM1, LM2, and LM3 include a first compensation electrode LM1, a second compensation electrode LM2, and a third compensation electrodes LM3. The first to third compensation electrodes LM1, LM2, and LM3 may be electrically connected to the power supply lines VL to receive the first power supply voltage.

The power supply lines VL may be divided into a first group VL_G1 connected to the first compensation electrode LM1, a second group VL_G2 connected to the second compensation electrode LM2, and a third group VL_G3 connected to the third compensation electrode LM3. The power supply lines VL of the first group VL_G1 are connected to the first pixels PX1 and the second pixels PX2 (see FIG. 4). The power supply lines VL of the second group VL_G2 are connected to the first pixels PX1 and the third pixels PX3 (see FIG. 4). The power supply lines of the third group DL_G3 are connected to the first pixels PX1 (see FIG. 4).

The power supply lines VL of the first group VL_G1 may receive the first power supply voltage through a first power supply line PL1, and the power supply lines VL of the second group VL_G2 may receive the first power supply voltage through the first power supply line PL2. Also, the power supply lines VL of the third group VL_G3 may receive the first power supply voltage through the third power supply line PL3.

The feedback wires FB1 and FB3 are disposed in the non-display area NDA. As one example, the feedback wires FB1 and FB3 include a first feedback wire FB1 and a third feedback wire FB3. The first feedback wire FB1 is connected to the first compensation electrode LM1 and the third feedback wire FB3 is connected to the third compensation electrode LM3. In FIG. 15, the second feedback wire FB2 connected to the second compensation electrode LM2 is not provided.

Although not shown in the drawings, if the display panel DP has a structure in which the feedback wire is drawn out from only one of the first and second compensation electrodes LM1 and LM2, unlike the display device 105 described in association with FIG. 15, the second feedback wire FB2 may be drawn from the second compensation electrode LM2 and the first feedback wire FB1 drawn from the first compensation electrode LM1 may be omitted.

Further, although not shown in the drawings, in another embodiment, unlike the display device 105 shown in FIG. 15, only one of the first and second scan driving circuits SDC1 and SDC2 may be provided on the display panel DP. If only the first scan driving circuit SDC1 is provided on the display panel DP, it may be more advantageous to arrange the second feedback wire FB2 than to arrange the first feedback wire FB1 in terms of space securing aspects.

The first and third feedback wires FB1 and FB3 may feed back the first power supply voltage to the driving circuit chip DIC. Here, a voltage fed back through the first feedback wire FB1 is defined as a first feedback power supply voltage, and a voltage fed back through the third feedback wire FB3 is defined as a third feedback power supply voltage.

Figure 16:
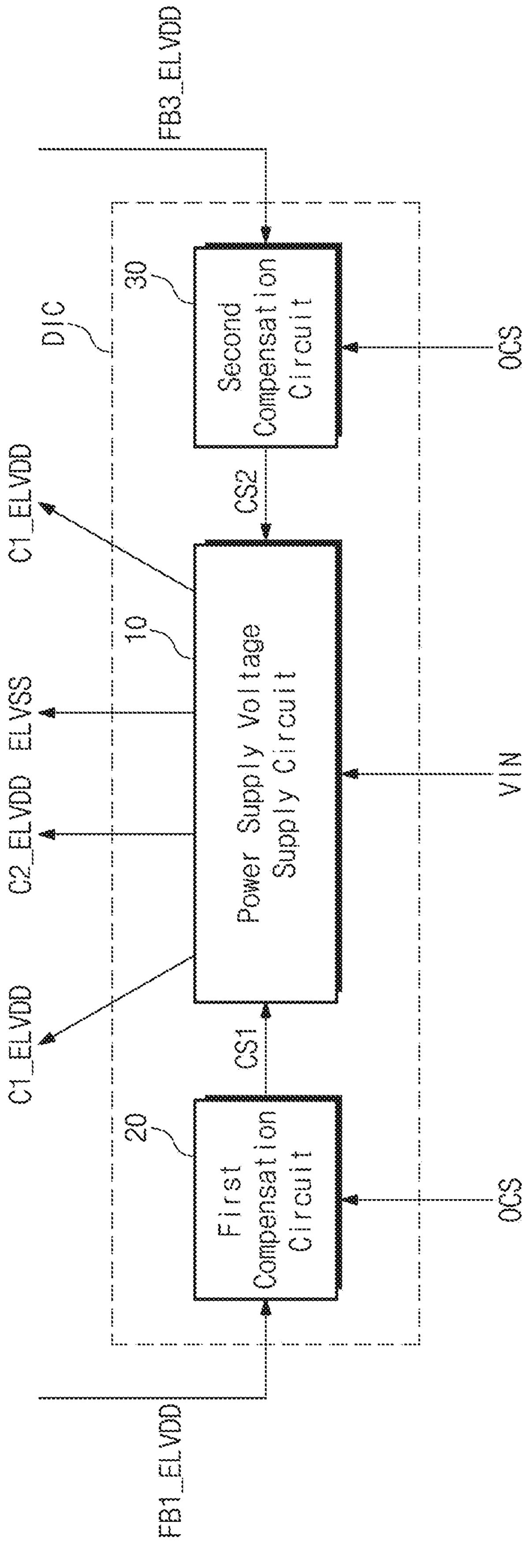
FIG. 16 is an internal block diagram of the driving circuit chip shown in FIG. 15 according to some exemplary embodiments.

FIG. 16 is an internal block diagram of the driving circuit chip shown in FIG. 15 according to some exemplary embodiments.

Referring to FIGS. 15 and 16, a driving circuit chip DIC according to an embodiment, includes a power supply voltage supply circuit 10, and first and second compensation circuits 20 and 30. The power supply voltage supply circuit 10 receives a power supply voltage VIN from a power supply unit (not shown). The power supply voltage supply circuit 10 converts the power supply voltage VIN to generate a first power supply voltage ELVDD and a second power supply voltage ELVSS lower than the first power supply voltage ELVDD.

The power supply voltage supply circuit 10 may include a DC-DC converter (now shown). The power supply voltage supply circuit 10 may include a boosting converter (not illustrated) for boosting the power supply voltage VIN to generate the first power supply voltage ELVDD. In addition, the power supply voltage supply circuit 10 may include a buck converter (not depicted) for reducing the power supply voltage VIN to generate the second power supply voltage ELVSS.

The power supply voltage supply circuit 10 may receive the control signals CS1 and CS2 and generate the first power supply voltage ELVDD having a predetermined constant level in response to the control signals CS1 and CS2. The control signals CS1 and CS2 may include a first compensation signal CS1 and a second compensation signal CS2.

The first compensation circuit 20 receives an external control signal OCS and a first feedback power supply voltage FB1_ELVDD fed back through the first feedback wire FB1 (see FIG. 15). The first compensation circuit 20 may compare the first feedback power supply voltage FB1_ELVDD with a predetermined reference voltage (not shown), and may generate the first compensation signal CS1 according to the comparison result. Also, the second compensation circuit 30 receives the external control signal OCS and the third feedback power supply voltage FB3_ELVDD fed back through the third feedback wire FB3 (see FIG. 15). The second compensation circuit 30 may compare the third feedback power supply voltage FB3_ELVDD with a predetermined reference voltage, and may generate the second compensation signal CS2 according to the comparison result.

The power supply voltage supply circuit 10 generates a first compensation power supply voltage C1_ELVDD in response to the first compensation signal CS1 and generates a second compensation power supply voltage C2_ELVDD in response to the second compensation signal CS2. The first compensation power supply voltage C1_ELVDD output from the power supply voltage supply circuit 10 is supplied to the power supply lines VL of the first and second groups VL_G1 and VL_G2 through the first and second power supply lines PL1 and PL2 (see FIG. 15). Also, the second compensation power supply voltage C2_ELVDD output from the power supply voltage supply circuit 10 is supplied to the power supply lines VL of the third group VL_G3 through the third power supply line PL3 (see FIG. 15).

The configuration of the driving circuit chip DIC is not limited to the above-noted configuration. For example, when a voltage (hereinafter referred to as a third feedback power supply voltage) is fed back to the driving circuit chip DIC through the second feedback line FB2 as shown in FIG. 10, the driving circuit chip DIC may further include a third compensation circuit (not shown) for receiving the third feedback power supply voltage.

According to various exemplary embodiments, by applying different compensation power supply voltages to the power supply lines VL of the first to third groups VL_G1 to VL_G3 through the driving circuit chip DIC, the distortion of the first power supply voltage may be accurately compensated for each area.

According to various exemplary embodiments, a first power supply voltage may be fed back to a power supply voltage supply circuit through a feedback wire electrically connected to an end of the power supply line disposed in a non-display area adjacent to at least one of second and third pixel areas, and the power supply voltage supply circuit may compensate for the voltage input to the input of the power supply line based on the feedback voltage. As such, it is possible to improve image quality defects due to distortion associated with the power supply line, e.g., distortion caused, at least in part, by RC delay.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
- a base layer comprising a display area and a non-display area adjacent to the display area, the display area comprising a first pixel area and a second pixel area protruding from the first pixel area;
- first pixels in the first pixel area;
- second pixels in the second pixel area;
- a power supply line extending in at least a first direction in the display area, the power supply line being configured to:
  - receive a first power supply voltage through a first end of the power supply line; and
  - supply the first power supply voltage to the first and second pixels;

a power supply voltage supply circuit electrically connected to the first end of the power supply line to supply the first power supply voltage to the power supply line through the first end; and a feedback wire electrically connected to a second end of the power supply line disposed in the second pixel area, the feedback wire being electrically connected to the power supply voltage supply circuit to feed back the first power supply voltage to the power supply voltage supply circuit, wherein the power supply voltage supply circuit is configured to receive a feedback power supply voltage fed back through the feedback wire, compare the feedback power supply voltage with a reference voltage, and generate a compensation power supply voltage according to the comparison result to provide the compensation power supply voltage to the first end of the power supply line.

2. The display device of claim 1, further comprising:

first scan lines extending in a second direction intersecting the first direction in the first pixel area, the first scan lines being configured to provide a first scan signal to the first pixels; and second scan lines extending in the second direction in the second pixel area, the second scan lines being configured to provide a second scan signal to the second pixels, wherein a width of the first pixel area in the second direction is greater than a width of the second pixel area in the second direction, and wherein a length of the first scan lines in the second direction is longer than a length of the second scan lines in the second direction.

3. The display device of claim 2, further comprising:

a first compensation wire disposed in the non-display area and extending from the second scan lines; and a first compensation electrode overlapping the first compensation wire in the non-display area.

4. The display device of claim 3, wherein:

the first compensation electrode is electrically coupled to the second end of the power supply line to receive the first power supply voltage; and the feedback wire is branched from the first compensation electrode and is electrically connected to the second end of the power supply line through the first compensation electrode.

5. The display device of claim 3, further comprising:

a feedback electrode electrically connected to the second end of the power supply line, wherein the first compensation electrode is configured to receive a second power supply voltage of a different level than the first power supply voltage, and wherein the feedback wire is branched from the feedback electrode and is electrically connected to the second end of the power supply line through the feedback electrode.

6. The display device of claim 2, wherein:

the display area further comprises a third pixel area protruding from the first pixel area and spaced apart from the second pixel area in the second direction; and a width of the first pixel area in the second direction is larger than a width of the third pixel area in the second direction.

7. A display device comprising:

a base layer comprising a display area and a non-display area adjacent to the display area, the display area comprising a first pixel area, a second pixel area, and a third pixel area, wherein the second pixel area and the third pixel area protrude from the first pixel area and are spaced apart from each other;

first pixels in the first pixel area;

second pixels in the second pixel area;

third pixels in the third pixel area;

power supply lines extending in at least a first direction in the display area, the power supply lines being configured to:

receive a first power supply voltage through first ends of the power supply lines, the power supply lines comprising second ends; and supply the first power supply voltage to the first pixels, the second pixels, and the third pixels, wherein a first group of the power supply lines is connected to a first some of the first pixels and the second pixels, a second group of the power supply lines is connected to a second some of the first pixels and the third pixels, and a third group of the power supply lines is connected to a third some of the first pixels;

a power supply voltage supply circuit electrically connected to the first ends of the power supply lines to supply the first power supply voltage to the power supply lines through the first ends; and a feedback wire electrically connected to the second end of at least one of the power supply lines disposed in one of the second pixel area and the third pixel area, the feedback wire being electrically connected to the power supply voltage supply circuit to feed back the first power supply voltage to the power supply voltage supply circuit, wherein the power supply voltage supply circuit is configured to receive a feedback power supply voltage fed back through the feedback wire, compare the feedback power supply voltage with a reference voltage, and generate a compensation power supply voltage according to the comparison result to provide the compensation power supply voltage to the first ends of the power supply lines.

8. The display device of claim 7, further comprising:

first scan lines extending in a second direction intersecting the first direction in the first pixel area, the first scan lines being configured to provide a first scan signal to the first pixels;

second scan lines extending in the second direction in the second pixel area, the second scan lines being configured to provide a second scan signal to the second pixels; and third scan lines extending in the second direction in the third pixel area, the third scan lines being configured to provide a third scan signal to the third pixels, wherein a width of the first pixel area in the second direction is greater than each of a width of the second pixel area in the second direction and a width of the third pixel area in the second direction, and wherein a length of the first scan lines in the second direction is longer than each of a length of the second scan lines in the second direction and a length of the third scan lines in the second direction.

9. The display device of claim 8, further comprising:

a first compensation wire disposed in the non-display area and extending from the second scan lines;

a first compensation electrode overlapping the first compensation wire in the non-display area;

a second compensation wire disposed in the non-display area and extending from the third scan lines; and a second compensation electrode overlapping the second compensation wire in the non-display area.

10. The display device of claim 9, wherein:

the first compensation electrode is electrically connected to the second ends of a first some of the power supply lines to receive the first power supply voltage;

the second compensation electrode is electrically connected to the second ends of a second some of the power supply lines to receive the first power supply voltage;

wherein the feedback wire comprises at least one of:

a first feedback wire branched from the first compensation electrode and electrically connected to the second ends of the first group of the power supply lines through the first compensation electrode; and a second feedback wire branched from the second compensation electrode and electrically connected to the second ends of the second group of the power supply lines through the second compensation electrode.

11. The display device of claim 9, further comprising:

a feedback electrode electrically connected to the second ends of some of the power supply lines, wherein the second compensation electrode is configured to receive a second power supply voltage of a different level than the first power supply voltage, and wherein the feedback wire is branched from the feedback electrode and is electrically connected to the second ends of the some of the power supply lines through the feedback electrode.

12. The display device of claim 8, further comprising:

data lines, wherein the data lines comprise a first group connected to the first some of the first pixels and the second pixels, a second group connected to the second some of the first pixels and the third pixels, and a third group connected to the third some of the first pixels.

13. The display device of claim 12, further comprising:

a third compensation electrode disposed in the non-display area between the second and third pixel areas, wherein data lines of the third group extend to the non-display area and overlap the third compensation electrode.

14. The display device of claim 13, wherein:

the third compensation electrode is electrically connected to the second ends of some of the power supply lines to receive the first power supply voltage; and the feedback wire comprises a third feedback wire electrically connected to the second ends of the some of the power supply lines through the third compensation electrode.

15. The display device of claim 13, wherein:

the third compensation electrode comprises first sub-compensation electrodes and second sub-compensation electrode spaced apart from the first sub-compensation electrodes in the second direction; and each of the first and second sub-compensation electrodes is electrically connected to the second ends of some of the power supply lines to receive the first power supply voltage.

16. The display device of claim 15, wherein the feedback wire comprises first and second sub-feedback wires branched from the respective first and second sub-compensation electrodes and electrically connected to the second ends of the some of the power supply lines through the respective first and second sub-compensation electrodes.

17. The display device of claim 8, wherein the power supply voltage supply circuit is configured to apply a different compensation power supply voltage to the power supply lines of the first group than the power supply lines of the second group and/or the third group.

18. A display device comprising:

a base layer comprising a display area and a non-display area adjacent to the display area, the display area comprising a first pixel area, a second pixel area, and a third pixel area, wherein the second and third pixel areas protrude from the first pixel area and are spaced apart from each other;

first pixels in the first pixel area;

second pixels in the second pixel area;

third pixels in the third pixel area;

power supply lines extending in at least a first direction in the display area, the power supply lines being configured to:

receive a first power supply voltage through first ends of the power supply lines; and supply the first power supply voltage to the first pixels, the second pixels, and the third pixels, wherein a first group of the power supply lines is connected to a first some of the first pixels and the second pixels, a second group of the power supply lines is connected to a second some of the first pixels and the third pixels, and a third group of the power supply lines is connected to a third some of the first pixels;

a power supply voltage supply circuit electrically connected to the first ends of the power supply lines to supply the first power supply voltage to the power supply lines through the first ends;

a first feedback wire electrically connected to second ends of the power supply lines of the first and second groups, the first feedback wire being electrically connected to the power supply voltage supply circuit to feed back the first power supply voltage to the power supply voltage supply circuit;

a second feedback wire electrically connected to second ends of the power supply lines of the third group, the second feedback wire being electrically connected to the power supply voltage supply circuit to feed back the first power supply voltage to the power supply voltage supply circuit; and a compensation electrode extending from the second ends of the power supply lines of the first and second groups, wherein the first feedback wire is directly connected to the compensation electrode.

19. The display device of claim 18, further comprising:

first scan lines extending in a second direction intersecting the first direction in the first pixel area, the first scan lines being configured to provide a first scan signal to the first pixels;

second scan lines extending in the second direction in the second pixel area, the second scan lines being configured to provide a second scan signal to the second pixels;

third scan lines extending in the second direction in the third pixel area, the third scan lines being configured to provide a third scan signal to the third pixels;

a first group of data lines connected to the first some of the first pixels and the second pixels;

a second group of data lines connected to the second some of the first pixels and the third pixels; and a third group of data lines connected to the third some of the first pixels, wherein a width of the first pixel area in the second direction is larger than each of a width of the second pixel area in the second direction and a width of the third pixel area in the second direction.

20. The display device of claim 19, further comprising:

a first compensation wire disposed in the non-display area and extending from the second scan lines; and a second compensation wire extending from the third scan lines, wherein the compensation electrode comprises:

a first compensation electrode overlapping the first compensation wire in the non-display area;

a second compensation electrode overlapping the second compensation wire in the non-display area; and a third compensation electrode overlapping the third group of data lines in the non-display area, and wherein the first feedback wire is branched from at least one of the first and second compensation electrodes and the second feedback wire is branched from the third compensation electrode.

* * * * *